United States Patent
Higo et al.

(10) Patent No.: US 9,437,267 B2
(45) Date of Patent: Sep. 6, 2016

(54) STORAGE ELEMENT AND MEMORY

(71) Applicant: Sony Corporation, Tokyo (JP)

(72) Inventors: Yutaka Higo, Kanagawa (JP);
Masanori Hosomi, Tokyo (JP);
Hiroyuki Ohmori, Kanagawa (JP);
Kazuhiro Bessho, Kanagawa (JP);
Tetsuya Asayama, Tokyo (JP);
Kazutaka Yamane, Kanagawa (JP);
Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/359,488

(22) PCT Filed: Nov. 19, 2012

(86) PCT No.: PCT/JP2012/007416
§ 371 (c)(1),
(2) Date: May 20, 2014

(87) PCT Pub. No.: WO2013/080482
PCT Pub. Date: Jun. 6, 2013

(65) Prior Publication Data
US 2014/0328119 A1 Nov. 6, 2014

(30) Foreign Application Priority Data

Nov. 30, 2011 (JP) ................. 2011-261853

(51) Int. Cl.
*G11C 11/16* (2006.01)
*H01F 10/32* (2006.01)
(Continued)

(52) U.S. Cl.
CPC .......... *G11C 11/161* (2013.01); *G11C 11/1675* (2013.01); *H01F 10/3254* (2013.01); *H01F 10/3286* (2013.01); *H01L 43/02* (2013.01); *G11C 11/5607* (2013.01); *H01F 10/329* (2013.01); *H01F 10/3272* (2013.01)

(58) Field of Classification Search
CPC ..................... G11C 11/161; G11C 11/5607
USPC ....................................................... 365/158
See application file for complete search history.

(56) References Cited

U.S. PATENT DOCUMENTS

| 5,695,864 A | 12/1997 | Slonczewski |
| 5,898,548 A | 4/1999 | Dill et al. |

(Continued)

FOREIGN PATENT DOCUMENTS

| CN | 1223431 | 7/1999 |
| EP | 2 450 903 | 5/2012 |

(Continued)

OTHER PUBLICATIONS

Chinese Office Action issued Dec. 1, 2015 in corresponding Chinese Application No. 201280057911.7.

(Continued)

*Primary Examiner* — Ly D Pham
(74) *Attorney, Agent, or Firm* — K&L Gates LLP

(57) ABSTRACT

A storage element includes a magnetization fixed layer, and a magnetization free layer. The magnetization fixed layer includes a plurality of ferromagnetic layers laminated together with a coupling layer formed between each pair of adjacent ferromagnetic layers. The magnetization directions of the ferromagnetic layers are inclined with respect to a magnetization direction of the magnetization fixed layer.

21 Claims, 11 Drawing Sheets

(51) Int. Cl.
*H01L 43/02* (2006.01)
*G11C 11/56* (2006.01)

(56) References Cited

U.S. PATENT DOCUMENTS

| | | | |
|---|---|---|---|
| 8,164,331 B2* | 4/2012 | Imai et al. | 324/252 |
| 2001/0009063 A1* | 7/2001 | Saito et al. | 29/603.08 |
| 2001/0018135 A1* | 8/2001 | Hasegawa et al. | 428/692 |
| 2002/0131218 A1* | 9/2002 | Beach | 360/324.12 |
| 2008/0094880 A1* | 4/2008 | Sugibayashi et al. | 365/158 |
| 2008/0291721 A1 | 11/2008 | Apalkov et al. | |
| 2009/0207533 A1* | 8/2009 | Shimazawa | 360/324.1 |
| 2009/0296462 A1* | 12/2009 | Kent et al. | 365/171 |
| 2010/0309713 A1* | 12/2010 | Fukami et al. | 365/158 |
| 2011/0007560 A1 | 1/2011 | Dieny et al. | |
| 2011/0102948 A1 | 5/2011 | Apalkov et al. | |
| 2011/0316102 A1* | 12/2011 | Ohmori et al. | 257/421 |
| 2012/0214020 A1* | 8/2012 | Chou et al. | 428/811.2 |
| 2013/0161770 A1* | 6/2013 | Meng et al. | 257/421 |
| 2014/0021571 A1* | 1/2014 | Lei et al. | 257/427 |
| 2014/0299950 A1* | 10/2014 | Kim et al. | 257/421 |

FOREIGN PATENT DOCUMENTS

| | | |
|---|---|---|
| EP | 2 472 521 | 7/2012 |
| JP | 2003-017782 | 1/2003 |
| JP | 2012-104825 | 5/2012 |
| JP | 2013-15300 | 6/2013 |
| JP | 2013-115299 | 6/2013 |
| JP | 2013-115301 | 6/2013 |
| TW | 200903486 | 1/2009 |
| WO | 2011/005484 | 1/2011 |

OTHER PUBLICATIONS

Japanese Office Action issued Mar. 1, 2016 in corresponding Japanese Application No. 2011-261853.
Chinese Office Action issued Jun. 1, 2016 in corresponding Chinese Application No. 201280057911.7.

* cited by examiner

STORAGE ELEMENT AND MEMORY

CROSS REFERENCES TO RELATED APPLICATIONS

The present application is a national stage of International Application No. PCT/JP2012/007416 filed on Nov. 19, 2012 and claims priority to Japanese Patent Application No. 2011-2618523 filed on Nov. 30, 2011, the disclosure of which is incorporated herein by reference.

BACKGROUND

The present technology relates to a storage element and a memory which have a plurality of magnetic layers and perform recording while using a spin torque magnetization reversal.

Various types of information devices such as a mobile terminal and a mass storage server have made rapid progress. Therefore, memories and elements such as logic elements composing these devices have been expected to have higher performance such as high integration, high speed processing and low consumed power. Particularly, nonvolatile semiconductor memories have considerably made progress, and a flash memory acting as a mass storage file memory has been diffused so as to expel a hard disc drive. In contrast, a ferroelectric random access memory (FeRAM), a magnetic random access memory (MRAM), a phase-change random access memory (PCRAM) and the like have been developed so as to be used in place of a NOR flash memory, a dynamic random access memory (DRAM) and the like generally used now, while being considered to be used for a code storage and further to be developed as a working memory. A part of these developed RAMs have been already put to practical use.

The MRAM among these RAMs performs data recording based on the magnetization direction of a magnetic substance so as to be rewritable substantially limitless times ($10^{15}$ times or more) at high speed. Therefore, the MRAM has been already used in fields of industrial automation, aircrafts and the like. Because of high speed operation and reliability of the MRAM, it is expected that the MRAM is developed as a code storage or a working memory. However, the MRAM has problems in actual use in view of low consumed power and large storage capacity. These problems result from a recording principle of the MRAM, that is, a recording method in which the magnetization direction is reversed by a magnetic field induced by an electric current of a wire.

As one of methods for solving these problems, recording not depending on the magnetic field of the current, that is, a magnetization reversing method has been examined. Especially, the spin torque magnetization reversal has been actively researched (e.g., refer to Patent Literatures (PTL) 1 and 2).

In the same manner as the MRAM, a storage element using the spin torque magnetization reversal is often structured by a magnetic tunnel junction (MTJ) and a tunneling magnetoresistive (TMR) element. In this structure, the phenomenon that a spin polarized electron passing through a magnetic layer of which magnetization is fixed in a direction gives a torque to another free magnetic layer (of which magnetization is not fixed) when entering this free magnetic layer (also called spin transfer torque) is utilized. When a current having a value equal to or more than a threshold value flog the magnetization direction of this free magnetic layer is reversed. The rewriting of 0 and 1 is performed by changing the polarity of the current.

The absolute value of the current for the reversal of the magnetization is equal to or less than 1 mA when the storage element has the size of approximately 0.1 µm Further, because this current value is decreased with the element volume, the size adjustment is possible. Moreover, because no word wire to induce the magnetic field of current for recording in the MRAM is used, there is a merit that the cell structure is simplified.

Hereinafter, the MRAM using the spin torque magnetization reversal is called a spin torque magnetic random access memory (ST-MRAM). The spin torque magnetization reversal is also called a spin injection magnetization reversal. This ST-MRAM is greatly expected as a nonvolatile memory in which low consumed power and large storage capacity are possible while the merits of the MRAM being operated at high speed and being rewritable substantially limitless time maintained.

CITATION LIST

Patent Literature

[PTL 1]
Japanese Patent Application Laid-open No. 2003-17782
[PTL 2]
U.S. Pat. No. 5,695,864

SUMMARY

However, the strength of the spin torque causing the magnetization reversal in the ST-MRAM is changed with the magnetization direction. In the structure of the storage element having the normal ST-MRAM, a magnetization angle at which the spin torque is equal to zero exists.

When a magnetization angle in the ST-MRAM set in an initial state accords with this magnetization angle, the time necessary for the magnetization reversal is considerably lengthened. Therefore, the magnetization reversal is sometimes not completed within a writing period of time.

When the reversal is not completed within a writing period of time, this writing operation is failed (writing error), and no normal writing operation can be performed.

In view of the circumstances as described above, it is desirable to provide a storage element and a memory which are capable of performing a writing operation in a short time without causing any writing error.

In an embodiment, a storage element includes a magnetization fixed layer, and a magnetization free layer. The magnetization fixed layer includes a plurality of ferromagnetic layers laminated together with a coupling layer formed between each pair of adjacent ferromagnetic layers. The magnetization directions of the ferromagnetic layers are inclined with respect to a magnetization direction of the magnetization fixed layer.

In another embodiment, a method of writing information to a storage element including a magnetization fixed layer, and a magnetization free layer including a plurality of ferromagnetic layers laminated together with a coupling layer formed between each pair of adjacent ferromagnetic layers is provided. The method includes applying a current in a magnetization direction of the magnetization fixed layer to cause a spin torque magnetization reversal in the magnetization free layer. The magnetization directions of the ferromagnetic layers are inclined with respect to the magnetization direction of the magnetization fixed layer.

In another embodiment, a spin torque magnetic random access memory element includes a magnetization fixed layer having a fixed magnetization in a perpendicular direction relative to a film surface of the magnetization fixed layer, a magnetization free layer including a plurality of ferromagnetic layers laminated together with a coupling layer formed between each pair of adjacent ferromagnetic layers, thereby magnetically coupling the ferromagnetic layers, and a non-magnetic layer formed between the magnetization fixed layer and the magnetization free layer. The magnetization directions of the ferromagnetic layers are inclined with respect to the perpendicular direction.

In another embodiment, a magnetoresistive effect type magnetic head includes a first magnetic shield formed on a substrate via an insulating layer; a magnetic sensing element including a magnetization fixed layer, and a magnetization free layer including a plurality of ferromagnetic layers laminated together with a coupling layer formed between each pair of adjacent ferromagnetic layers, and a second magnetic shield formed on the magnetic sensing element via the insulating layer. The magnetization directions of the ferromagnetic layers are inclined with respect to a magnetization direction of the magnetization fixed layer.

In the storage element according to the first embodiment of the present technology, although a period of time necessary for the magnetization reversal is dispersed when the directions of the magnetizations of both the storage layer and the magnetization fixed layer become approximately parallel or antiparallel to each other, this dispersion may be suppressed by the magnetic coupling between the ferromagnetic layers composing the storage layer. Therefore, the writing of information may be performed by reversing the direction of the magnetization of the storage layer within a predetermined finite period of time.

Further, the value of the writing current used to reverse the direction of the magnetization of the storage layer may be reduced.

Moreover, because of strong anisotropic magnetic energy held in the perpendicular magnetization film, the thermal stability of the storage layer may be sufficiently maintained.

Further, in the memory according to the second embodiment of the present technology, a current flows through the storage element in the lamination direction via the two types of wires, and spin transfer occurs. Therefore, by a current flowing through the storage element in the lamination direction via the two types of wires, the recording of information based on the spin torque magnetization reversal may be performed.

Further, because the thermal stability of the storage element may be sufficiently maintained, information recorded in the storage element may be stably held, and the downsizing, the improvement of reliability and low consumed power in the memory may be achieved.

As described above, according to the present technology, because the writing of information while reversing the direction of the magnetization of the storage layer within a predetermined period of time may be performed, the writing error may be reduced, and the writing operation may be performed in a shorter time.

Further, because the writing error may be reduced, the reliability in the writing operation may be improved. Moreover, because the writing operation may be performed in a shorter time, the operation speed may be heightened.

Accordingly, the memory having the high reliability in the writing operation and being operated at high speed may be achieved according to the present technology.

Additional features and advantages are described herein, and will be apparent from the following Detailed Description and the figures.

BRIEF DESCRIPTION OF THE FIGURES

FIG. 1 is a schematic perspective view of a memory according to an embodiment of the present technology.
FIG. 2 is a cross-sectional view of the memory according to the embodiment.
FIG. 3 is a plan view of the memo according to the embodiment.
FIG. 4 is a schematic structural view (cross-sectional view) of a storage element having a storage layer which includes a magnetic substance magnetized in the direction perpendicular to a film surface.
FIG. 5 is a schematic structural view (cross-sectional view) of the storage element according to the embodiment.
FIG. 6A is a schematic structural view (perspective view) of the storage layer according to the embodiment.
FIG. 6B is a schematic structural view (top view) of the storage layer according to the embodiment.
FIG. 7 is a diagram in which a range of magnetic-coupling energy is plotted.
FIG. 8 is a diagram in which a relation between the magnetic-coupling energy and an index of thermal stability is plotted.
FIG. 9 is a diagram in which a range of magnetic energy is plotted.
FIG. 10 is a diagram in which a relation between excitation energy and a reversal time is plotted.
FIG. 11A is an explanatory perspective view of a magnetic head to which the embodiment is applied.
FIG. 11B is an explanatory cross-sectional view of the magnetic head.

DETAILED DESCRIPTION

Hereinafter, an embodiment of the present technology will be described in the following order.
<1. Schematic Structure of Memory According To This Embodiment>
<2. Overview of Storage Element According to This Embodiment>
<3. Concrete Structure according to This Embodiment>
<4. Modification>
<1. Schematic Structure of Memory According to this Embodiment>

Figure 1:
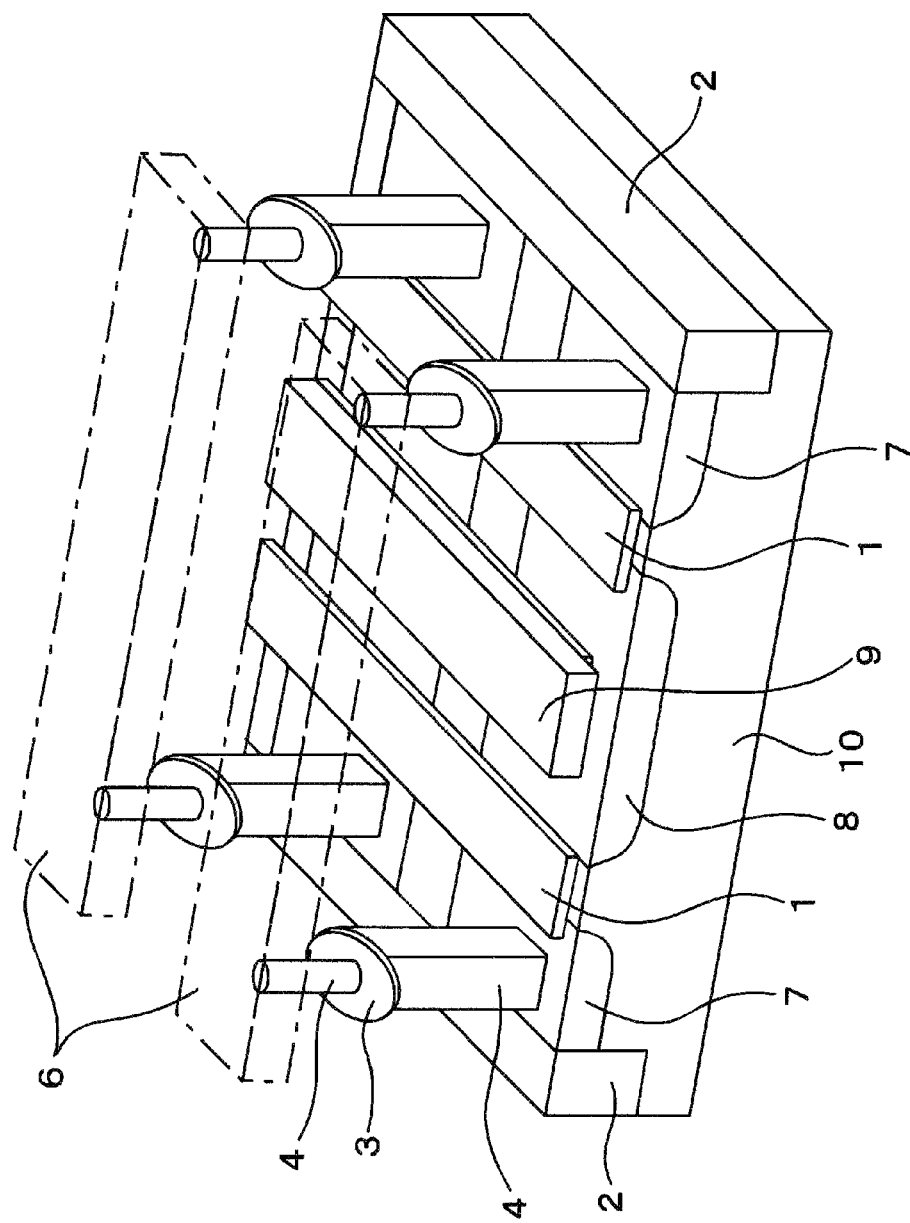
[FIG. 1]
Figure 2:
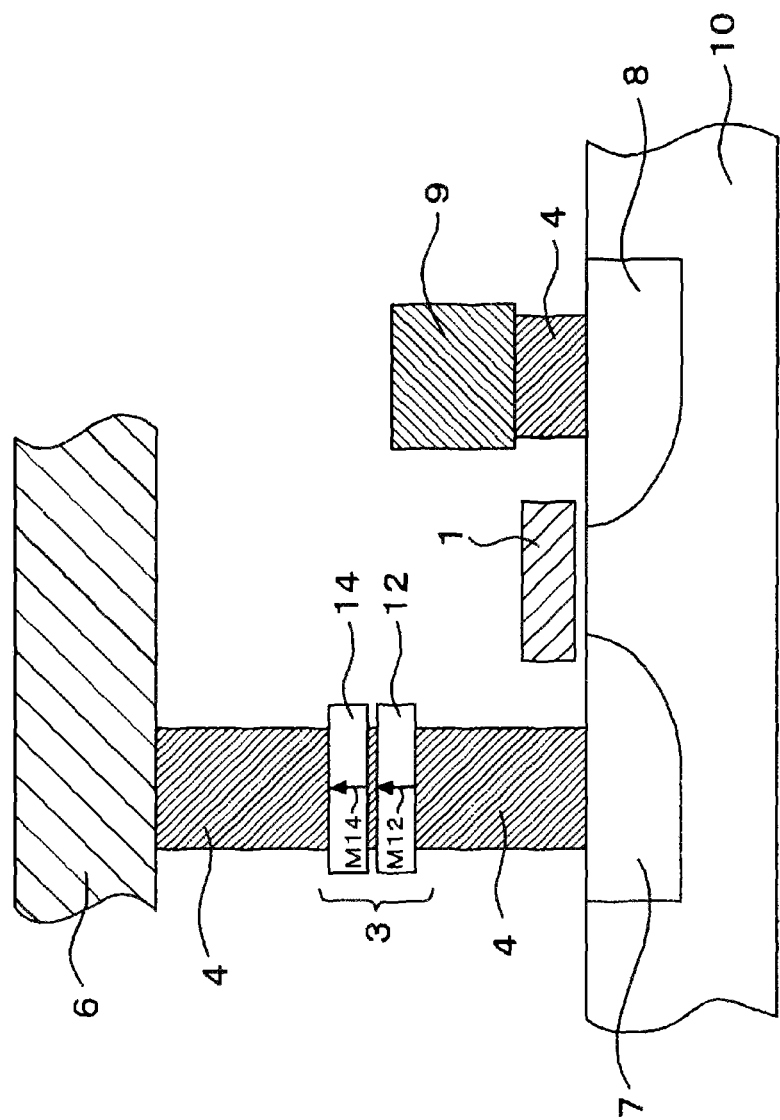
[FIG. 2]
Figure 3:
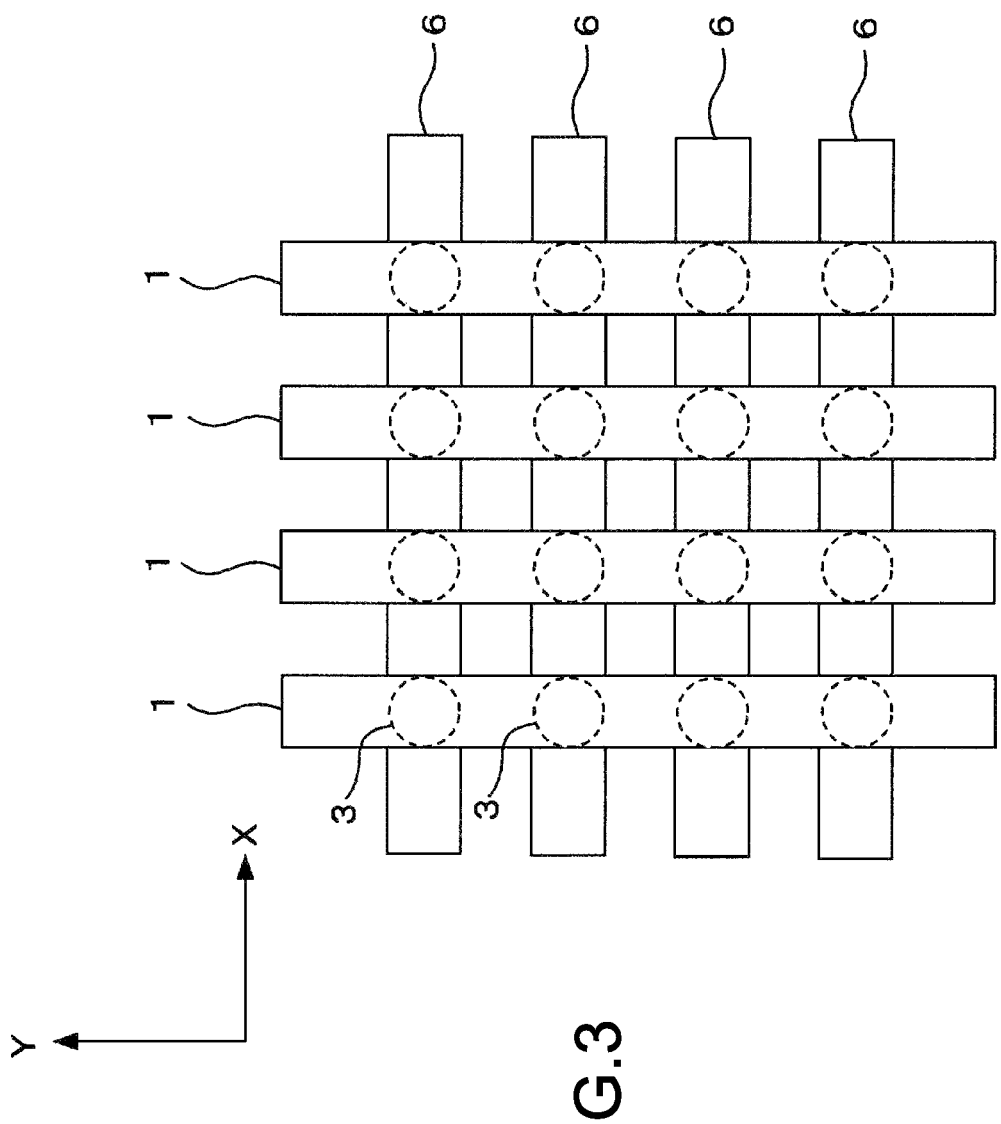
[FIG. 3]

Initially, a schematic structure of a memory will be described. Schematic views of a memory are shown in FIG. 1, FIG. 2 and FIG. 3. FIG. 1 is a perspective view, FIG. 2 is a sectional view, and FIG. 3 is a plan view.

As shown in FIG. 1, in the memory, a storage element 3 having a ST-MRAM is located near each of cross-over points of two types of address wires (e.g., word lines and bit lines) extending perpendicular to each other. The ST-MRAM is capable of holding information indicated by a magnetic state. More specifically, a drain region 8, a source region 7, and a gate electrode 1 that constitute a selecting transistor for selecting each of memory cells are formed in a portion separated by element separating layers 2 of a semiconductor body 10 such as a silicon substrate. The gate electrode 1 also acts as one address wire (the word line) extending in the front-back direction in FIG. 1.

The drain region 8 is formed in common to two selecting transistors located on right and left sides in FIG. 1. A wire 9 is connected to this drain region 8. The storage element 3 having a storage layer is located between the source region 7 and a bit line 6 being located on an upper side and extending in the lateral direction in FIG. 1. The direction of the magnetization of the storage layer is reversed by a spin torque magnetization reversal. The storage element 3 is, for example, formed of a magnetic tunnel junction element (a MTJ element).

As shown in FIG. 2, the storage element 3 has two magnetic layers 12 and 14. One of these magnetic layers 12 and 14 is a magnetization fixed layer 12 in which the direction of magnetization M12 is fixed, and the other magnetic layer is a storage layer 14, that is, a free magnetized layer in which the direction of magnetization M14 is changeable.

Further, the storage element 3 is connected to the bit line 6 and the source region 7 via respective upper and lower contact layers 4.

Therefore, when a current flows through the storage element 3 via two types of address wires 1 and 6 in the vertical direction, the direction of the magnetization M14 of the storage layer 14 may be reversed by a spin torque magnetization reversal.

As shown in FIG. 3, in the memory, a large number of first wires bit lines) 1 and a large number of second wires (e.g., word lines) 6 are arranged perpendicular to one another in the matrix shape, and the storage elements 3 are located on cross-over points of the wires 1 and 6.

Each storage element 3 is formed in a circular shape in the plane thereof and has a cross-sectional structure shown in FIG. 2.

Further, as shown in FIG. 2, the storage element 3 has one magnetization fixed layer 12 and one storage layer (free magnetized layer) 14.

Each storage element 3 forms one of memory cells of the memory.

In the memory described above, it is necessary to perform a writing operation by a current having an amount equal to or lower than a saturation current of the selecting transistor. It is well known that the saturation current of the transistor is decreased with downsizing of the transistor. Therefore, to downsize the memory, it is desirable that the efficiency in spin transfer be improved to reduce the current flowing through the storage element 3.

Further, to increase the level of a read-out signal, a large magnetic resistance changing rate should be secured. Therefore, it is effective to adopt the MTJ structure as described above. More specifically, it is effective that the storage element 3 has an intermediate layer being a tunnel insulating layer (a tunnel barrier layer) between the magnetic layers 12 and 14.

When the tunnel insulating layer is used as the intermediate layer as described above, the amount of the current flowing through the storage element 3 is restricted to prevent the tunnel insulating layer from receiving dielectric breakdown. That is, in view of securing the reliability in the repeated writing to the storage element 3, it is desirable that a current necessary for the spin torque magnetization reversal be suppressed. The current necessary for the spin torque magnetization reversal is sometimes called a reversing current or a storing current.

Further, because the memory is a nonvolatile memory, it is necessary to stably store information written by the current in other words, it is necessary to secure stability (thermal stability) to thermal fluctuation of the magnetization of the storage layer.

Assuming that the thermal stability of the storage layer is not secured, the direction of the reversed magnetization is sometimes reversed again due to heat (temperature in operation circumstances), and a holding error is undesirably caused.

As compared with the past MRAM, the storage element (ST-MRAM) 3 in this memory has the advantage of sizing. That is, it is possible to reduce the volume of the element 3. However, the volume reduction causes deterioration of the thermal stability if other characteristics are not changed.

Because the increase in the storage capacity of ST-MRAM further reduces the volume of the storage element 3, the securing of the thermal stability is important.

Therefore, the thermal stability in the storage element 3 of T-RAM is a very important characteristic, and it is desirable that the element 3 be designed so as to secure this thermal stability even if the volume of the element 3 is reduced.

<2. Overview of Storage Element According to this Embodiment>

Next, the abstract of the storage element according to this embodiment will be described.

Figure 4:
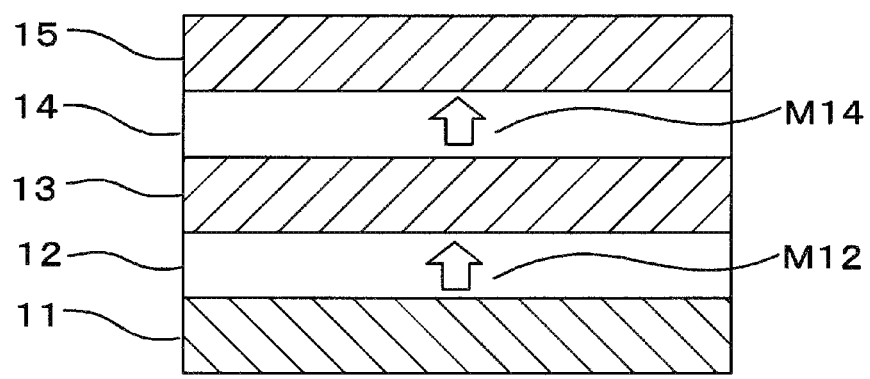
[FIG. 4]

A schematic structural view (a cross-sectional view) of the storage element of ST-MRAM in which the direction of magnetization is perpendicular to a film surface of the element is shown in FIG. 4.

As shown in FIG. 4, the storage element has the magnetization fixed layer (also called a reference layer) 12, located on an underlayer 11, in which the direction of the magnetization M12 is fixed, an intermediate layer (a nonmagnetic layer) 13, the storage layer (the free magnetized layer) 14 in which the direction of the magnetization M14 is changeable, and a cap layer 15 that are laminated in that order.

In the layer 12 of these layers, the direction of the magnetization M12 is fixed by a high coercive force and the like to be perpendicular to a film surface of the layer 12.

In the storage element shown in FIG. 4, the storage of information indicated by the direction of the magnetization (a magnetic moment) M14 of the storage layer 14 having uniaxial anisotropy is performed.

The writing of information to the storage element is performed by applying a current in the direction perpendicular to film surfaces of the layers of the storage element (i.e., the lamination direction of the layers) to cause a spin torque magnetization reversal in the free magnetized layer becoming the storage layer 14.

Here, the spin torque magnetization reversal will be described in brief.

An electron has one of two types of spin angular momentums, and these are provisionary called an upper spin angular momentum and a lower spin angular momentum.

In the inside of a nonmagnetic substance, the number of electrons having the upper spin angular momentum is equal to the number of electrons having the lower spin angular momentum. In the inside of a ferromagnetic substance, these numbers differ from each other.

Initially, the case where, when the directions of the magnetizations M12 and M14 are antiparallel to each other in two ferromagnetic substance layers (the magnetization fixed layer 12 and the free magnetized layer 14) laminated each other via the intermediate layer (the nonmagnetic layer) 13, electrons are moved from the magnetization fixed layer 12 to the storage layer (the free magnetized layer) 14 is considered.

Spins of electrons passing through the magnetization fixed layer 12 are polarized. That is, the number of electrons having the upper spin angular momentum differs from the number of electrons having the lower spin angular momentum.

When the thickness of the nonmagnetic layer 13 is sufficiently thin, the electrons reach another magnetic substance, that is, the storage layer (the free magnetized layer) 14 before the spin polarization is lightened so as to be set in the non-polarized state (the number of electrons having the upper spin angular momentum is equal to the number of electrons having the lower spin angular momentum) of a normal none nonmagnetic substance.

Then, because signs of spin polarization level in two ferromagnetic substance layers (the magnetization fixed layer 12 and the free magnetized layer 14) differ from each other, the spin in a part of the electrons is reversed to reduce energy in this system. That is, the direction of the spin angular momentum is changed. At this time, because the whole angular momentum in the system should be conserved, a reaction equivalent to the sum of changes in the angular momentum caused by the electrons, of which the spin direction is changed, is given to the magnetization M14 of the storage layer (the free magnetized layer) 14.

When the amount of the current, that is, the number of electrons passing per unit time is small, the number of electrons of which the spin direction is changed is also small. Therefore, a change in the angular momentum caused in the magnetization M14 of the storage layer (the free magnetized layer) 14 is also small. In contrast, when the amount of the current is increased, a large change in the angular momentum may be given within one unit time.

The time change in the angular momentum is a torque. When this torque exceeds a threshold value, the magnetization M14 of the storage layer (the five magnetized layer) 14 starts a precession and is stabilized due to the uniaxial anisotropy of the storage layer (the free magnetized layer) 14 when the rotational axis is rotated by 180 degrees. In other words, the reversal from the antiparallel state to the parallel state is caused.

In contrast, when a current flows inversely so as to send electrons from the storage layer (the free magnetized layer) 14 to the magnetization fixed layer 12 in the case where the directions of the magnetizations M12 and M14 of the two ferromagnetic substance layers 12 and 14 are parallel to each other, electrons are reflected by the magnetization fixed layer 12.

Then, when the electrons reflected so as to reverse the spin direction of the electrons enter the free magnetized layer 14, the electrons give a torque so as to reverse the direction of the magnetization M14 of the storage layer (the free magnetized layer) 14. Therefore, the magnetizations M12 and M14 may be changed to the antiparallel state.

In this case, the current amount necessary to cause this reversal becomes larger than the current amount necessary to cause the change from the antiparallel state to the parallel state.

It is difficult to intuitively recognize the change from the parallel state to the antiparallel state. However, it may be thought that the direction of the magnetization M12 of the magnetization fixed layer 12 is difficult to be reversed because the magnetization M12 is fixed, but the direction of the magnetization M14 of the free magnet zed layer 14 is reversed to conserve the angular momentum of the whole system.

As described above, the recording of information being each of 0 and 1 is performed by a current flowing in one direction from the magnetization fixed layer (reference layer) 12 to the storage layer (the free magnetized layer) 14 or in the opposite direction at a value equal to or higher than a threshold value corresponding to the polarity of the current.

The reading-out of the information is performed by using the magnetoresistive effect in the same manner as in the past MRAM.

More specifically, in the same manner as the case of the information recording described above, a current flows in the direction perpendicular to the film surface of each layer (the lamination direction of each layer). Then, because the electric resistance indicated by the storage element when the direct on of the magnetization M14 of the storage layer (the free magnetized layer) 14 is parallel to the direction of the magnetization M12 of the magnetization fixed layer (reference layer) 12 differs from the electric resistance when the direction of the magnetization M14 is antiparallel to the direction of the magnetization M12, this phenomenon is utilized.

The material used for the intermediate layer nonmagnetic layer) 13 may be metal or insulator. However, when insulator is used for the nonmagnetic layer 13, a read-out signal of a higher level (a higher change rate of resistance) may be obtained, and the recording using a current of a lower value may be performed. This element using the insulator is called a magnetic tunnel junction (MTJ) element.

The strength of the spin torque described above changes with the angle between the magnetization M14 of the storage layer (the free magnetized layer) 14 and the magnetization M12 of the magnetization fixed layer (the reference layer) 12. When the unit vector indicating the direction of the magnetization M14 is expressed by m1 while the unit vector indicating the direction of the magnetization M12 is expressed by m2, the strength of the spin torque is proportional to $m1 \times (m1 \times m2)$. Here, "x" denotes the outer product of a vector.

The magnetization M12 of the magnetization fixed layer 12 is normally fixed to the direction of easy magnetization axis of the storage layer 14. The magnetization M14 of the storage layer 14 is apt to be directed to the easy magnetization axis direction of the storage layer 14 itself. At this time, the vectors m1 and m2 make an angle of 0 or 180 degrees. Therefore, no spin torque acts at all according to the spin torque equation described above.

In the actual case, the magnetization M14 of the storage layer 14 is distributed at random around the easy magnetization axis due to thermal fluctuation. When the direction of the magnetization M14 to the direction of the magnetization M12 of the magnetization fixed layer 12 goes away from the angle of 0 degree or 180 degrees, a spin torque acts, and the magnetization reversal may be caused.

A magnetic substance has magnetic energy of a strength corresponding to the direction of magnetization thereof. The direction most reducing the magnetic energy is the easy magnetization axis. When no thermal fluctuation is caused, the magnetization is directed to the easy magnetization axis by a force (a torque) minimizing the magnetic energy. In contrast, when the magnetization direction is apart from the easy magnetization axis due to the thermal fluctuation, the magnetic energy becomes large as compared with the magnetic energy set when the magnetization is directed to the easy magnetization axis. This difference is called excitation energy E. Then, when the magnetization direction further goes away from the easy magnetization axis such that the excitation energy E exceeds a certain threshold value, the magnetization reversal is caused. This threshold value is expressed by Δ. The threshold value Δ may be regarded as energy necessary to reverse the magnetization. Although the excitation energy E and the threshold value Δ are expressed by the unit of joule (J), dimensionless quantities obtained by dividing these by thermal energy (a product of Boltzmann's constant and absolute temperature) are used hereinafter. In this case, because the threshold value Δ may be regarded as an index indicating the stability of the magnetization to the thermal energy, the threshold value Δ is sometimes called an index of thermal stability.

When the excitation energy E of the magnetization M14 of the storage layer 14 and the index Δ of thermal stability are used, a current I applied to the storage layer 14 and a time period (a reversal time) $t_s$ necessary for a spin torque magnetization reversal caused by the current I satisfy the following Equation 1.

$$\frac{\eta(I - I_{c0})t_s}{e} = \left(\frac{M_s V}{\mu_B}\right)\ln\left(\frac{\pi}{2}\sqrt{\frac{\Delta}{E}}\right)$$

Here, Ic0 denotes a threshold current necessary to cause a spin torque magnetization reversal, η denotes a spin polarization rate of the current I, e denotes an electric charge of electron, Ms denotes a saturation magnetization of the magnetization M14, V denotes a volume of the storage layer 14, and $\mu_B$ denotes the Bohr magneton.

The left side of the Equation 1 corresponds to the number of electrons injected into the storage layer 14. The right side of the Equation 1 corresponds to the number of electrons existing in the storage layer 14. The scale of these numbers is adjusted by the logarithm term. The value of the excitation energy E corresponds to the magnetization direction at the time the current is applied.

As found from this Equation 1, the reversal time is infinitely diverged while the excitation energy E approaches zero. As described above, when no thermal fluctuation is caused, the magnetization M14 is directed to the easy magnetization axis corresponding to the energy E of zero, and the diversion of the reversal time is a problem.

Therefore, in this technology, to suppress the diversion of the reversal time described above, the storage layer is configured to have at least two or more ferromagnetic layers laminated via a coupling layer. The two ferromagnetic layers adjacent to each other are magnetically coupled with each other via the coupling layer inserted between them.

In the structure of the memory according to the embodiment of the present technology described above, because the directions of the magnetizations of both the storage layer and the magnetization fixed layer become approximately parallel or antiparallel to each other by the magnetic coupling between the ferromagnetic layers composing the storage layer, the diversion of the time period necessary for the magnetization reversal may be suppressed, and the writing of information performed by reversing the direction of the magnetization of the storage layer within a predetermined finite period of time may be possible.

<3. Concrete Structure According to this Embodiment>

Next, the embodiment according to the present technology will be concretely described.

Figure 5:
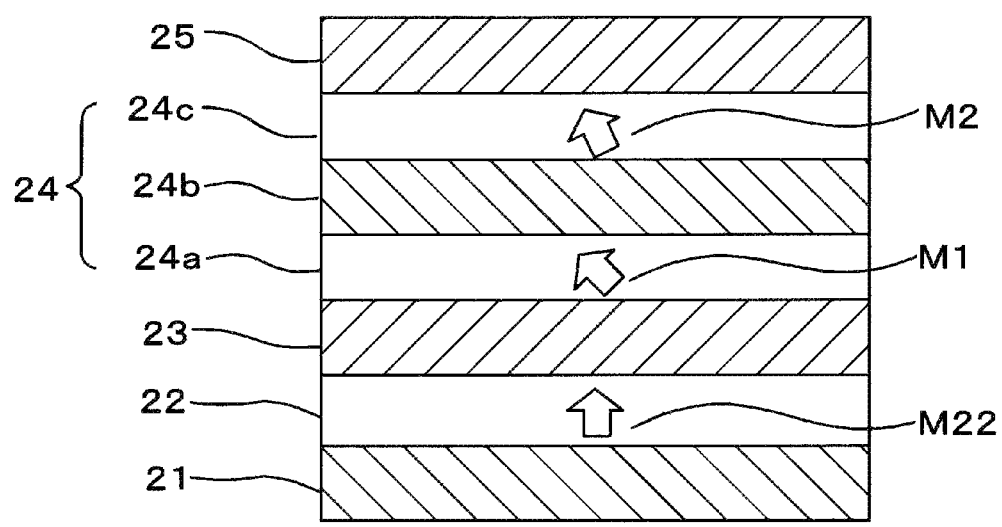
[FIG. 5]

FIG. 5 is a schematic structural view (a cross-sectional view) of a storage element composing the memory according to the embodiment of the present technology.

A storage element 20 shown in FIG. 5 has a magnetization fixed layer (also called a reference layer) 22, located on an underlayer 21, in which the direction of a magnetization M22 is fixed, an intermediate layer (a nonmagnetic layer) 23, a storage layer (a five magnetized layer) 24 in which the direction of magnetization is changeable, and a cap layer 25 that are laminated in that order.

In the magnetization fixed layer 22, the magnetization M22 is fixed to be directed to the direction perpendicular to a film surface of the magnetization fixed layer 22 (the upper direction in FIG. 5).

The structure described above is the same as the structure of ST-MRAM shown in FIG. 4.

An anti-ferromagnetic (not shown) formed of an anti-ferromagnetic substance may be located between the underlayer 21 and the magnetization fixed layer 22 to fix the direction of the magnetization M22 of the magnetization fixed layer 22.

Further, the storage element 20 according to this embodiment differs from the structure of MTJ of ST-MRAM shown in FIG. 4 in that the storage layer 24 includes a multiplayer film in which a plurality of ferromagnetic layers and a coupling layer are laminated on one another. In FIG. 5, the storage layer 24 includes a three-layer structure having a ferromagnetic layer 24a, a coupling layer 24b, and a ferromagnetic layer 24c that are located in that order.

A magnetization M1 of the ferromagnetic layer 24a and a magnetization M2 of the ferromagnetic layer 24c are magnetically coupled with each other via the coupling layer 24b. As the material of the coupling layer 24b, nonmagnetic metals such as Ta and Ru may be used.

As the material of the intermediate layer (the nonmagnetic layer) 23 located between the magnetization fixed layer 22 and the storage layer 24, insulating materials (various oxides) for forming a tunnel insulating film or nonmagnetic metals used for a layer located between magnetic layers of a magnetoresistive effect element may be used.

When an insulating material is used as the material of this intermediate layer (the nonmagnetic layer) 23 as described above, a read-out signal of a higher level (a higher change rate of resistance) may be obtained, and recording using a current of a lower value may be performed.

As materials of the magnetization fixed layer 22 and the storage layer 24, various magnetic materials used for MTJ of the past ST-MRAM may be used.

For example, CoFe may be used for the magnetization fixed layer 22, and CoFeB may be used for the storage layer 24.

Further, materials of NiFe, TePt, CoPtTbFeCo, GdFeCo, CoPd, MnBi, MnGa, PtMnSb, and Co—Cr family may be used. Moreover, magnetic materials other than these materials may be used.

In the same manner as in the storage element 3 shown in FIG. 4, the reading-out of information is performed by using the magnetoresistive effect.

More specifically, in the same manner as the recording of information described above, a current flows in the direction perpendicular to the film surface of each layer (the lamination direction of each layer). Then, the phenomenon that the electric resistance indicated by the storage element is changed with a relative angle between the direction of the magnetization M22 of the magnetization fixed layer 22 and the direction of the magnetization M1 of the ferromagnetic layer 24a is used.

Figure 6:
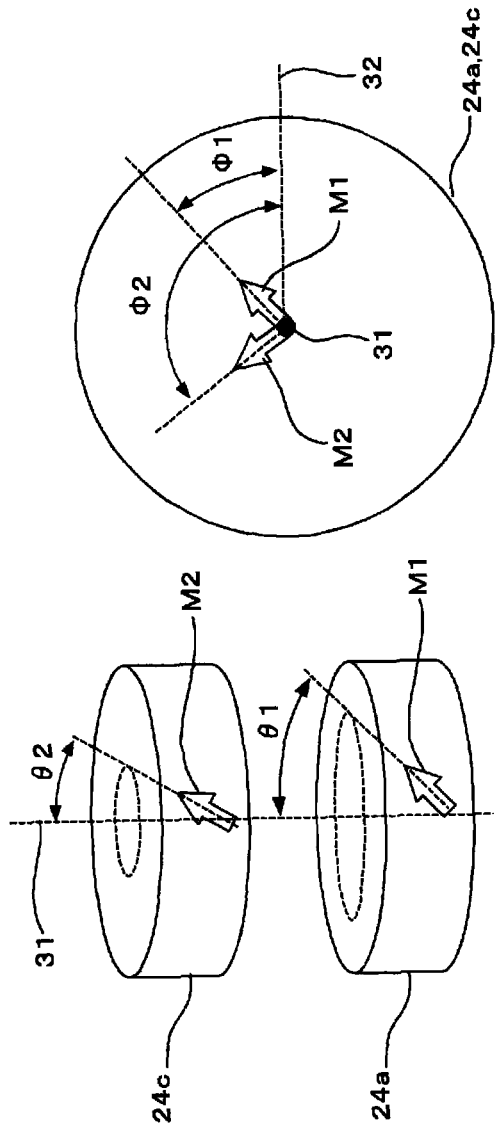
[FIG. 6A]
[FIG. 6B]

The structure of the storage layer 24 is shown further in detail in a perspective view of FIG. 6A and a top view of FIG. 6B. The intermediate layer 24b is omitted in FIG. 6A and FIG. 6B for simplification. In the storage element 20 according to this embodiment, the storage layer 24 is formed in a column shape. To describe the directions of the magnetizations M1 and M2, angles $\theta 1$, $\theta 2$, $\phi 1$ and $\phi 2$ are defined as follows. A perpendicular axis 31 penetrating through the storage layer 24 along the perpendicular direction is shown in the perspective view. The angle between the direction of the magnetization M1 and the perpendicular axis 31 is defined as $\theta 1$, and the angle between the direction of the magnetization M2 and the perpendicular axis 31 is defined as $\theta 2$. Further, a reference line 32 passing through the center of the storage layers 24a or 24c is shown in the top view. Because the storage layers 24a and 24c are commonly formed in a circular shape in cross-section, the direction of the reference line 32 may be arbitrarily selected. When the magnetizations M1 and M2 are respectively projected onto the film surfaces of the storage layers 24a and 24c, the angle between the direction of the magnetization M1 and the reference line 32 is defined as $\phi 1$, and the angle between the direction of the magnetization M2 and the reference line 32 is defined as $\phi 2$.

As described above, a magnetic substance has magnetic energy of a strength corresponding to the direction of the magnetization thereof. To describe the magnetic energy, the following values are defined. The energy difference obtained by subtracting a strength of the magnetic energy at the time the magnetization M1 is directed to the perpendicular direction ($\theta 1=0$ degree) from a strength of the magnetic energy at the time the magnetization M1 is directed to an in-surface direction ($\theta 1=90$ degrees) is indicated by $\Delta 1$. Further, the energy difference obtained by subtracting a strength of the magnetic energy at the time the magnetization M2 is directed to the perpendicular direction ($\theta 2=0$ degree) from a strength of the magnetic energy at the time the magnetization M2 is directed to an in-surface direction ($\theta 2=90$ degrees) is indicated by $\Delta 2$. Moreover, the strength of the magnetic coupling energy between the magnetizations M1 and M2 is indicated by $\Delta ex$. The differences $\Delta 1$ and $\Delta 2$, and the strength $\Delta ex$ are expressed by the unit of joule (J). However, in the same manner as the thermal energy E and the index $\Delta$ of thermal stability described above, dimensionless quantities obtained by dividing the differences and strength by thermal energy (a product of Boltzmann's constant and absolute temperature) are used.

In this case, the magnetic energy $\in$ of the storage layer 24 is expressed by the following Equation 2.

$$\in = \Delta_1 \sin^2\theta_1 + \Delta_2 \sin^2\theta_2 - \Delta_{ex}(\cos\theta_1 \cos\theta_2 + \sin\theta_1 \sin\theta_2 \cos(\phi_1 - \phi_2))$$

The excitation energy E of the storage layer 24 is expressed by an equation $E = \in - \in min$. Here, $\in min$ denotes the minimum value of the magnetic energy $\in$. In the same manner as the case of the storage layer 14 in FIG. 4, when no thermal fluctuation is caused, the excitation energy E becomes zero. That is, the directions of the magnetizations M1 and M2 are changed such that the magnetic energy $\in$ becomes $\in min$ (this state is called an equilibrium state). In the case of the storage layer 14, the relative angle between the direction of the magnetization M14 of the storage layer 14 and the direction of the magnetization M12 of the magnetization fixed layer 12 is 0 degree (parallel) or 180 degrees (antiparallel) when the excitation energy E reaches zero. Therefore, there is a problem that the reversal time is increased while no spin torque acts. However, the inventors of the present technology performed various examinations and realized that, when the excitation energy E reached zero, the directions of the magnetizations M1 and M2 might make angles other than 0 degree (parallel) or 180 degrees (antiparallel) to the direction of the magnetization M22 of the magnetization fixed layer 22 (the perpendicular axis). That is, the magnetizations M1 and M2 may be inclined with respect to the magnetization M22. At this time, because a finite spin torque acts, it may be expected that the increase of the reversal time is suppressed.

Here, while using the Equation 2, the inventors performed various examinations of a condition that the magnetizations M1 and M2 are inclined with respect to the magnetization M22. As a result, the condition was found out as follows. The case where the strength $\Delta ex$ of the magnetic coupling energy between the magnetizations M1 and M2 is equal to zero and the magnetizations M1 and M2 are separately moved is considered. According to the definition, when the difference $\Delta 1$ is positive, the easy magnetization axis of the magnetization M1 becomes perpendicular to the film surface of the ferromagnetic layer 24a, and the magnetization M1 in the equilibrium state is directed to the direction perpendicular to the film surface. In contrast, when the difference $\Delta 1$ is negative, the easy magnetization axis of the magnetization M1 is placed in the film surface, and the magnetization M1 in the equilibrium state is directed to an in-surface direction in the film surface of the ferromagnetic layer 24a. At this time, because the ferromagnetic layer 24a is isotropic with respect to the rotation about the perpendicular axis, the value of $\phi 1$ is arbitrary. In the same manner, when the difference $\Delta 2$ is positive, the easy magnetization axis of the magnetization M2 is perpendicular to the film surface, and the magnetization M2 in the equilibrium state is directed to the direction perpendicular to the film surface of the ferromagnetic layer 24c. In contrast, when the difference $\Delta 2$ is negative, the easy magnetization axis of the magnetization M2 is placed in the film surface of the ferromagnetic layer 24c, and the magnetization M2 in the equilibrium state is directed to an in-surface direction in the film surface. At this time, because the ferromagnetic layer 24c is isotropic with respect to the rotation about the perpendicular axis, the value of $\phi 2$ is arbitrary.

Next, the case original in this technology where the strength $\Delta ex$ of the magnetic coupling energy between the magnetizations M1 and M2 differs from zero while the magnetizations M1 and M2 are coupled with each other and moved is considered. According to the definition, when the strength $\Delta ex$ is positive, the directions of the magnetizations M1 and M2 are moved to be parallel. This is sometimes called ferromagnetic coupling. In contrast, when the strength $\Delta ex$ is negative, the directions of the magnetizations M1 and M2 are moved to be antiparallel. This is sometimes called anti-ferromagnetic coupling. To simplify the description hereinafter, although only the case where the strength $\Delta ex$ is positive is considered, the same discussion can be performed in the case where the strength $\Delta ex$ is negative.

When the differences $\Delta 1$ and $\Delta 2$ are positive together, the directions of the magnetizations M1 and M1 in the equilibrium state become parallel to the perpendicular axis regardless of the strength $\Delta ex$. This is the same as in the storage element 3 shown in FIG. 4, and the increase of the reversal time may be unavoidable. In contrast, when the differences $\Delta 1$ and $\Delta 2$ are negative together, the magnetizations M1 and M1 in the equilibrium state are respectively directed to in-surface directions in the film surfaces regardless of the strength Δex. At this time, regardless of the value of φ1, the relative angle between the direction of the magnetization M22 of the magnetization fixed layer 22 and the direction of the magnetization M1 of the ferromagnetic layer 24a becomes constantly 90 degrees. Therefore, no change in resistance due to the magnetoresistive effect is caused, and no information may be read out. In this case, a storage element in which the signs of the differences Δ1 and Δ2 are the same may not be used as a storage element composing the ST-MRAM. As described above, the signs of the differences Δ1 and Δ2 in the storage element 20 according to the embodiment of the present technology should be differentiated from each other.

As described above, when the signs of the differences Δ1 and Δ2 differ from each other, the easy magnetization axis of the magnetization of one ferromagnetic layer is perpendicular to the film surface while the easy magnetization axis of the magnetization of the other ferromagnetic layer is placed in the film surface.

These two magnetizations of which the directions conflict with each other may be inclined with respect to the perpendicular direction due to the coupling at the energy strength Δex. The energy strength Δex has an upper limit. Assuming that the strength Δex is infinitely large, the magnetizations M1 and M2 should be parallel to each other. In this case, according to magnitude correlation between the differences Δ1 and Δ2, the total of the easy magnetization axes becomes directed to be perpendicular to the film surface or to be placed in the film surface. Even though the strength Δex is not infinitely large, when the strength Δex is larger than a certain strength, the magnetizations M1 and M2 undesirably become parallel to each other.

Figure 7:
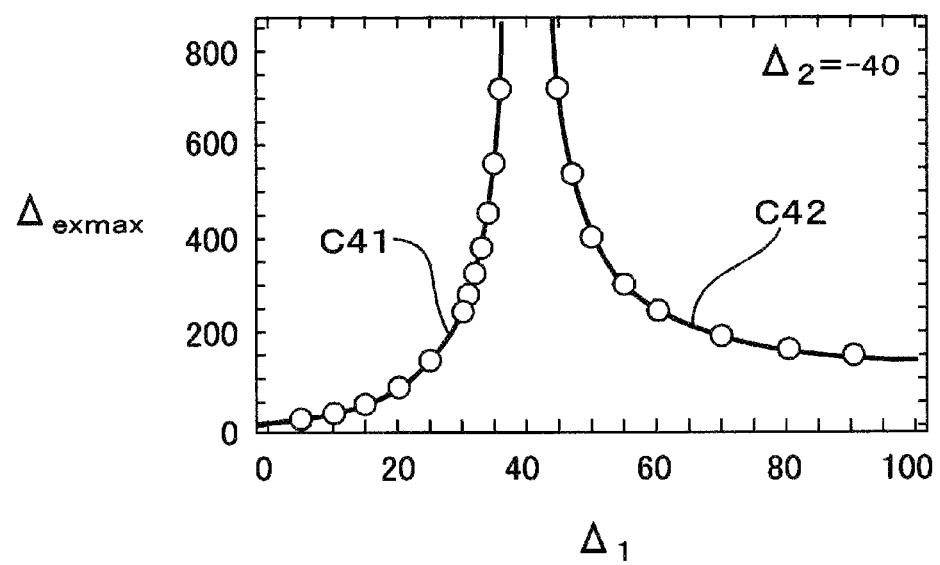
[FIG. 7]

Therefore, to determine the upper limit of the strength Δex, the inventors of the present technology calculated the upper limit Δexmax, at which the magnetizations M1 and M2 become parallel to each other, in the case of various combinations of the differences Δ1 and Δ2 by using the Equation 2. An example is shown in FIG. 7. In FIG. 7, the difference Δ2 is fixed to −40, and the difference Δ1 is changed in the range from 0 to 100. White circles indicate upper limits of the strength Δex determined by the calculation. When the strength Δex is smaller than the corresponding upper limit, the magnetizations M1 and M2 may be inclined together with respect to the perpendicular direction. The dependency of the limit Δexmax on the difference Δ1 in the case of the value Δ1+Δ2 being smaller than zero differs from the dependency in the case of the value Δ1+Δ2 being larger than zero. A curved line C41 indicates the Δ1 dependency of the strength Δexmax when the value Δ1+Δ2 is smaller than zero. In contrast, a curved line C42 indicates the Δ1 dependency of the strength Δexmax when the value Δ1+Δ2 is larger than zero. The inventors tried to find out an equation adequately expressing these curved lines, and realized that the curved lines C41 and C42 were expressed by the following equation, $$\Delta\text{exmax}=\text{abs}(2\times\Delta1\times\Delta2(\Delta1+\Delta2))$$

Here, abs denotes a function for changing to an absolute value. Now, only the case where the strength Δex is positive is considered in this equation. However, in the same manner, the equation is obtained in the case where the strength Δex is negative. As a result, the condition that the magnetizations M1 and M2 are inclined together with respect to the perpendicular direction is as follows.

$$\text{abs}(\Delta\text{ex})<\text{abs}(2\times\Delta1\times\Delta2/(\Delta1+\Delta2))$$

As described above, in the present technology, the condition that the magnetizations M1 and M2 are inclined together with respect to the perpendicular direction is found out. When the differences Δ1 and Δ2 and the strength Δex satisfying this condition are given, the equivalent state in which the magnetizations M1 and M2 are inclined with respect to the perpendicular axis is obtained. Then, the value obtained by subtracting the value of the magnetic energy in the equivalent state from the value of the magnetic energy indicated by the Equation 2 denotes the excitation energy E of the storage element 20 according to the embodiment of the present technology. Further, the excitation energy E necessary to reverse the directions of the magnetizations M1 and M2 is the index Δ of the thermal stability. Therefore, when the differences Δ1 and Δ2 and the strength Δex are given, the excitation energy E and the index Δ of the thermal stability are uniquely determined.

Figure 8:
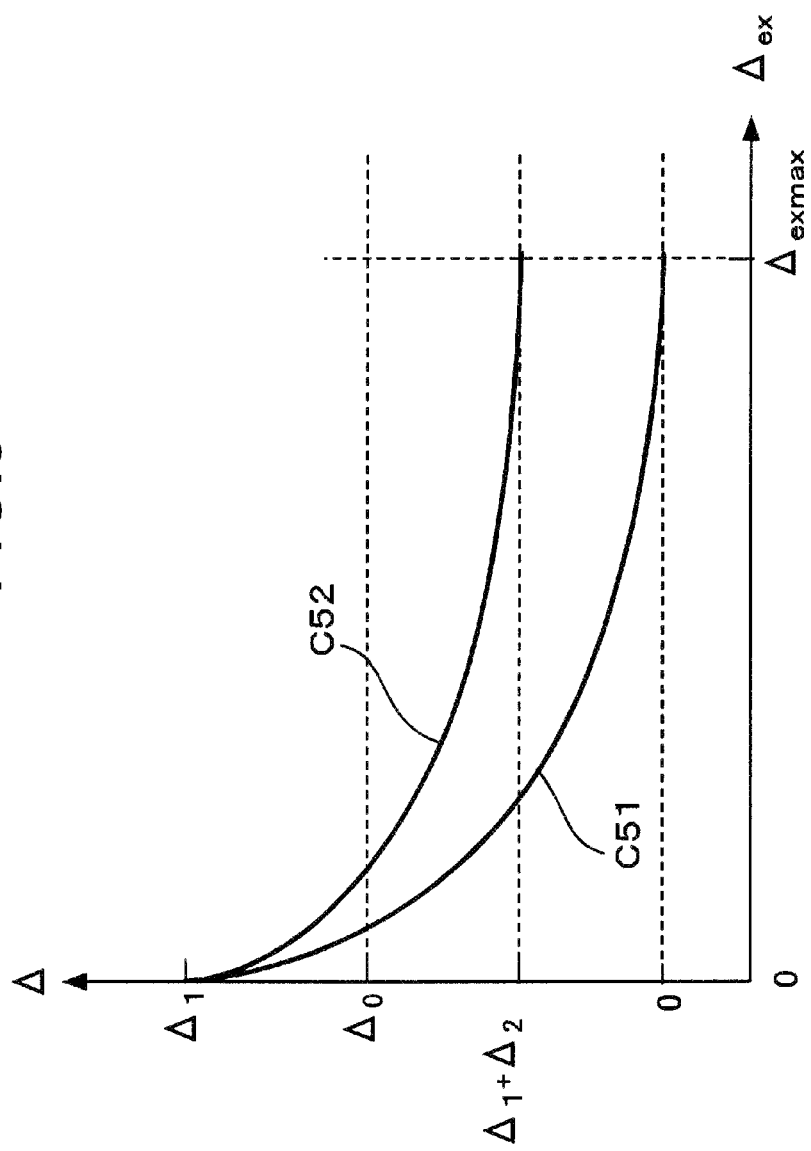
[FIG. 8]

The dependency of the index Δ of the thermal stability on the strength Δex is shown n FIG. 8. In FIG. 8, the relation Δ1>0>Δ2 is satisfied. However, the relation Δ2>0>Δ1 is also allowed. In this case, the differences Δ1 and Δ2 in FIG. 8 are changed with each other. When the strength Δex is zero, the index Δ is equal to the difference Δ1. Although the index Δ is decreased with the increase of the strength Δex, the dependency in the case of the value Δ1+Δ2 being smaller than zero differs from the dependency in the case of the value Δ1+Δ2 being larger than zero. A curved line C51 corresponds to the value Δ1+Δ2 being smaller than zero, while a curved line C52 corresponds to the value Δ1+Δ2 being larger than zero. When the value Δ1+Δ2 is smaller than zero, the difference Δ is converged to zero while the strength Δex approaches the limit Δexmax. In contrast, when the value Δ1+Δ2 is larger than zero, the index Δ is converged to the value Δ1+Δ2 while the strength Δex approaches the limit Δexmax.

The index Δ of thermal stability denotes an index indicating tolerance to the thermal fluctuation of the storage element 20. When the storage element 20 is used as a nonvolatile memory, it is necessary to hold information in a guaranteed operation period of time. This means that the index Δ of thermal stability should be higher than a certain constant value. Although the lower limit of the index Δ changes with the memory capacity and the guaranteed operation period of time, the lower limit is approximately within a range from 40 to 70. As the index Δ is increased, tolerance to heat is strengthened. However, because energy necessary for writing is also increased, it is not necessary to unnecessarily increasing the index Δ.

Now, the design value of the index Δ of thermal stability is indicated by Δ0. In this case, according to FIG. 8, the condition that the index Δ=Δ0 is obtained by adjusting the strength Δex is to satisfy the relation Δ1+Δ2<Δ0<Δ1. FIG. 8 shows the case of the relation Δ1>0>Δ2. However, when the case of the relation Δ2>0>Δ1 is also considered, the condition that the differences Δ1 and Δ2 should be satisfied is the relation Δ1+Δ2<Δ0<max(Δ1, Δ2). Here, max denotes a function for selecting a maximum value from the differences Δ1 and Δ2.

Figure 9:
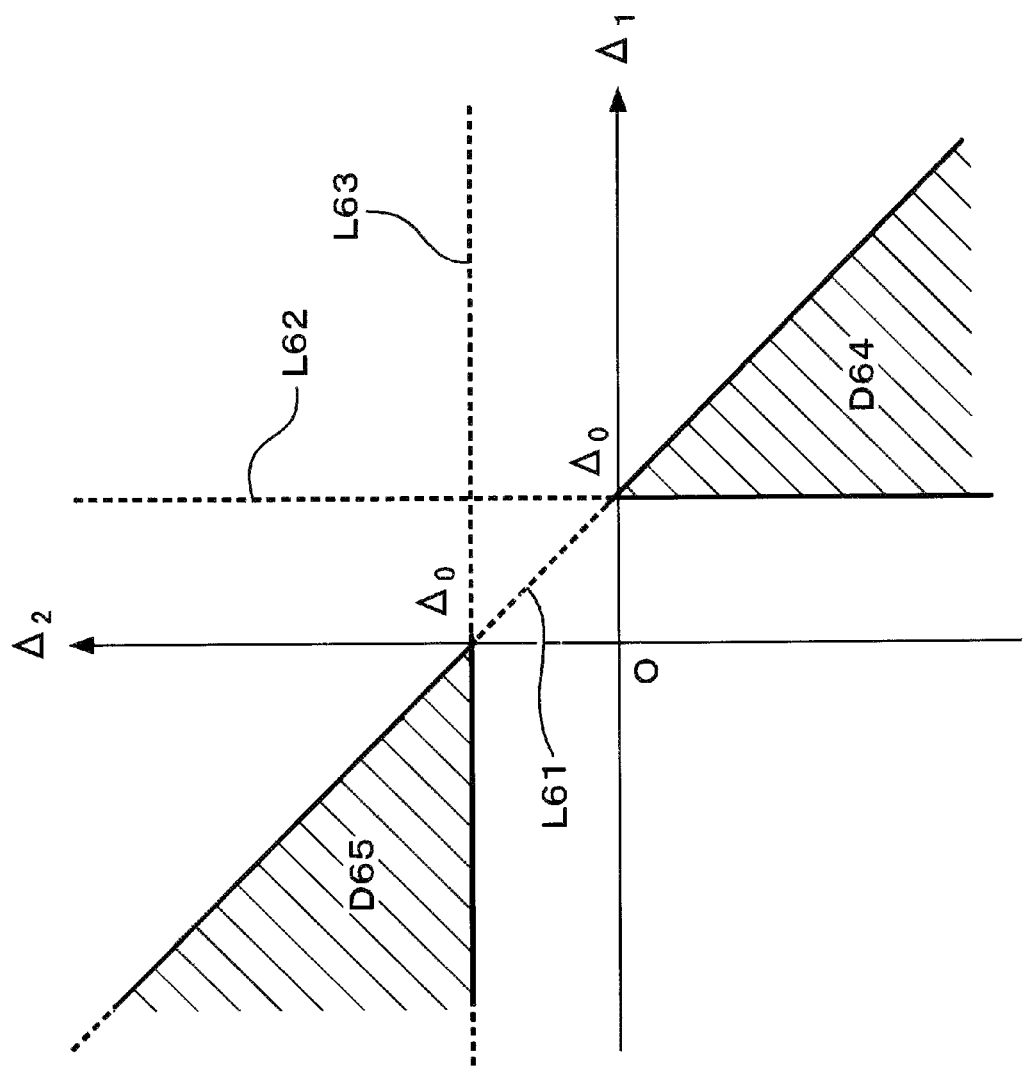
[FIG. 9]

Conditions that the differences Δ1 and Δ2 should be satisfied are platted in FIG. 9. Here, the design value of the index Δ of thermal stability is indicated by Δ0, A straight line L61 indicates the relation Δ1+Δ2=Δ0, a straight line L62 indicates the difference Δ1=Δ0, and a straight line L63 indicates the difference Δ2=Δ0. A region D64, placed on the lower side of the line L61 and placed on the right side of the line L62, and a region D65, placed on the lower side of the line L61 and placed on the upper side of the line L63, are a range of the differences Δ1 and Δ2 satisfying the condition of the relation Δ1+Δ2<Δ0<max(Δ1, Δ2).

When the differences Δ1 and Δ2 are placed together in the region D64 or D65, the strength Δex may be adjusted such that the index Δ of thermal stability becomes equal to the design value Δ0, and the directions of the magnetizations M1 and M2 at this time may be inclined with respect to the perpendicular axis. Although the condition that the signs of the differences Δ1 and Δ2 should be differentiated from each other has been described hereinbefore, this condition is automatically satisfied when the differences Δ1 and Δ2 are placed together in the region D64 or D65.

Next, the simulation about spin injecting magnetization reversal (spin torque transfer) in the case of using the storage element 20 according to the embodiment of the present technology is performed, while the simulation in the case of using the storage element 3 shown in FIG. 4 is performed for a comparison.

Figure 10:
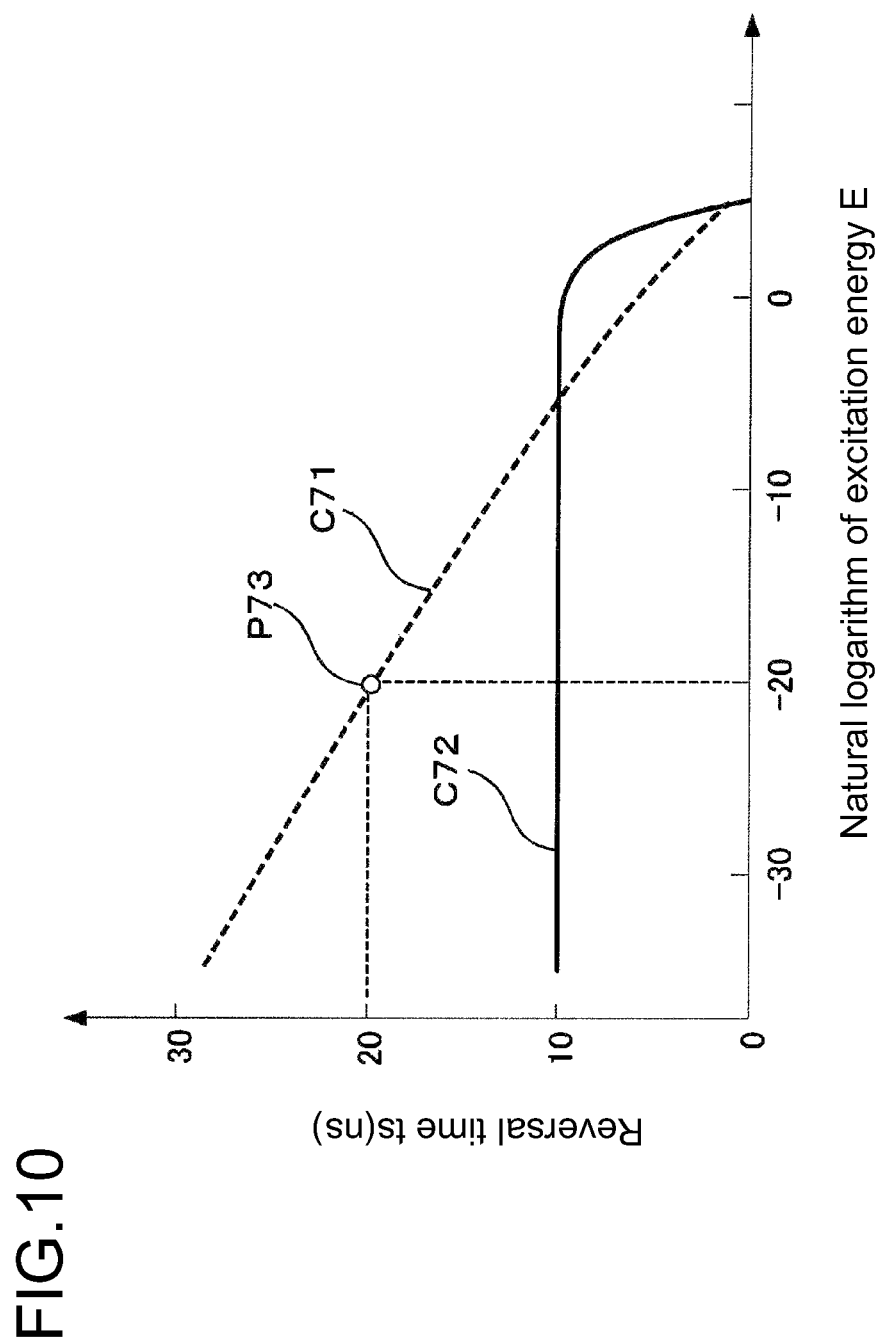
[FIG. 10]

FIG. 10 shows the relation between the excitation energy E and the reversal time ts for a certain current. The excitation energy E of the horizontal axis is plotted on a logarithm scale. Here, a value calculated from a magnetization direction at the time a current is applied is used as the excitation energy E. The magnetization direction is shifted from the equilibrium state due to thermal fluctuation. This means that this shift becomes large as the excitation energy E is increased (goes to the right side in FIG. 10).

As described above, the relation between the excitation energy E and the reversal tine ts in the storage element 3 is expressed by the Equation 1. When the magnetization is perfectly set in the equilibrium state, the infinite reversal time is necessary. However, in the actual case, because the value of the excitation energy E is equal to or higher than zero due to thermal fluctuation, the magnetization may be reversed in a finite period of time. This tendency is indicated by a curved line C71. When the excitation energy E of the horizontal axis is indicated on a logarithm scale, the curved line C71 is approximately a straight line. It will be realized that the magnetization is reversed in a shorter time as the excitation energy E is increased.

Now, it is assumed that a current application time is 20 nanoseconds. In this case, as indicated by a point P73, if the logarithmic value of the excitation energy E is equal to −20, the reversal just in 20 nanoseconds may be performed. The excitation energy E is not fixed to a certain constant value, but always changes due to thermal fluctuation. When the logarithmic value of the excitation energy E is equal to or higher than −20, the reversal in 20 nanoseconds may be performed. In contrast, when the logarithmic value of the excitation energy E is equal to or lower than −20, the reversal in 20 nanoseconds may not be performed. That is, a writing error is caused. As described above, in the storage element 3, when the magnetization angle at the time a current is applied is changed, the period of time necessary for the reversal is changed. Therefore, the writing operation sometimes succeeds and sometimes fails due to the influence of the change in the reversal time.

In contrast, the relation between the excitation energy E and the reversal time ts in the case of using the storage element 20 according to the embodiment of the present technology is indicated by a curved line C72. This line C72 differs from the curved line C71 for the storage element 3 shown in FIG. 4, and the line C72 indicates no increase of the reversal time ts even when the excitation energy E is decreased. The reason is that, because the directions of the magnetizations M1 and M2 are inclined with respect to the perpendicular axis even when the excitation energy E is equal to zero (a negative infinite value on a logarithm scale shown in FIG. 10), a finite spin torque acts on the magnetizations M1 and M2.

In the calculation example indicated by the curved line C72 shown in FIG. 10, when the logarithmic value of the excitation energy E is approximately equal to or lower than zero, the reversal time ts is constantly 10 nanoseconds. When the logarithmic value of the excitation energy E is approximately equal to or higher than zero, the reversal time ts is further shortened. This means that the reversal time ts does not exceed 10 nanoseconds even when the magnetizations M1 and M2 are directed to any directions at the time a current is applied. As described above, in the storage element 20 according to the embodiment of the present technology, the upper limit (10 nanoseconds in the calculation example shown in FIG. 10) of the reversal time ts is determined regardless of the directions of the magnetizations M1 and M2 set at the time a current is applied. Therefore, when a current application time is set to be equal to or larger than this upper limit, the writing can be performed without causing any writing error.

Here, the physical meaning of the excitation energy E will be supplemented. As described above, the value of the excitation energy E is finite due to thermal fluctuation, in the case where a storage layer is structured by a single ferromagnetic layer in the same manner as in the storage element 3 shown in FIG. 4, the probability that the excitation energy E becomes smaller than a value X is given by 1-exp(−X). (When a storage layer is structured by a plurality of ferromagnetic layers in the same manner as in the storage element 20 according to the embodiment of the present technology, this strict equation may not be given, but the tendency is almost the same.) In the calculation example shown in FIG. 10, the logarithmic value of the excitation energy E corresponding to the reversal time ts of 20 nanoseconds is −20. Therefore, when the logarithmic value of the excitation energy E is lower than −20; the writing in a current application time of 20 nanoseconds is failed. The probability that the logarithmic value of the excitation energy E is lower than −20 is calculated 1-exp(−exp(−20))≈2×10$^{-9}$ by using the equation 1-exp(−X). Therefore, the excitation energy E and the writing error, rate are closely related to each other, Even when the excitation energy E is small, it may be important to shorten the reversal time ts for the purpose of reducing the writing error rate. In consideration of this point, the embodiment of the present technology in which the reversal time ts is placed at a constant value even when the excitation energy E is small to any degree is appropriate for the purpose of reducing the writing error rate.

The memory using the storage element 20 shown in FIG. 5 is obtained by replacing the storage element 3 in the memory shown in FIG. 1, FIG. 2 and FIG. 3 with the storage element 20.

As shown in the drawings, in this memory, a large number of first wires (e.g., bit lines) 1 extend perpendicular to a large number of second wires (e.g., word lines) 6 in a matrix shape, and the storage element 20 is located at each of cross-over points of the first sires 1 and the second wires 6.

The storage element 20 is formed in a circular shape in a plane, and has a cross-sectional structure shown in FIG. 5.

Further, as shown in FIG. 5, the storage element 20 has the magnetization fixed layer 22 and the storage layer (the free magnetized layer) 24.

Each memory element 20 forms one of memory cells of the memory.

Each of the first wires 1 and the second wires 6 is electrically connected with the corresponding storage element 20, so that a current may flow through the storage element 20 via these wires 1 and 6 in the lamination direction (the vertical direction) of each layer of the storage element 20.

Then, when the current flows through the storage element 20, the directions of the magnetizations of the storage layer 24 are reversed. Therefore, the recording of information may be performed. More specifically, in the same manner as in the ST-MRAM shown in FIG. 4, the directions of the magnetizations of the storage layer 24 are reversed by changing the polarity of the current (the direction of the current) flowing through the storage element 20, and the recording of information is performed.

In the embodiment described above, in each storage element 20 composing one memory cell of the memory, the storage layer 24 has a laminated structure of the ferromagnetic layer 24a, the coupling layer 24b, and the ferromagnetic layer 24c. Because of this aminated structure, the magnetization M1 of the ferromagnetic layer 24a and the magnetization M2 of the ferromagnetic layer 24c may have the directions inclined with respect to the axis perpendicular to the film surfaces. Therefore, the phenomenon that no spin torque acts on the magnetizations M1 and M2 may be avoided.

That is, the recording of information may be performed by reversing the directions of the magnetizations M1 and M2 within a predetermined finite period of time.

Accordingly, in this embodiment, because the writing of information may be performed by reversing the directions of the magnetizations of the storage layer within a predetermined period of time, the writing error may be reduced, and the writing operation may be performed in a shorter time. Further, because the writing error may be reduced, the reliability in the writing operation may be improved. Moreover, because the wining operation may be performed in a shorter time, the operation may be performed at a high speed. That is, the memory having a high reliability in the writing operation while being operated at a high speed may be obtained.

In the embodiment described above, the storage layer (the free magnetized layer) 24 has a three-layer structure of the ferromagnetic layer 24a, the coupling layer 24b, and the ferromagnetic layer 24c. However, in the present technology, a laminated structure having an arbitrary number of layers other than the three-layer structure may be used.

Further, in the embodiment described above, the magnetization fixed layer (the reference layer) 22, the intermediate layer (the nonmagnetic layer) 23, and the storage layer (the free magnetized layer) 24 are located from the lower layer side in that order. However, in the present technology, the arrangement in which these layers are located in the reverse order in the vertical direction may be allowed. When the magnetization fixed layer 22 is located on the lower layer side like the embodiment described above, comparatively thick layers such as an antiferromagnetic layer (not shown) are located on the lower layer side. Therefore, as compared with the structure in which the layer 22 is located on the upper layer side, it is advantageous that the etching for patterning the storage element may be easily performed.

The present technology is not limited to only the embodiment described above, and may be variously modified without departing from the gist of the present technology.

<4. Modification>

The structure of the storage element 3 or the storage element 20 according to the embodiment of the present technology is used for a magnetoresistive effect element such as a TMR element. However, the magnetoresistive effect element acting as the TMR element may be applied to not only the memory described above but also a magnetic head, a hard disc drive quipped with this magnetic head, an integrated circuit chip, a personal computer, a portable terminal, a cellular phone, various electronic equipment such as a magnetic sensor device, electronic goods, and the like.

Figure 11A:
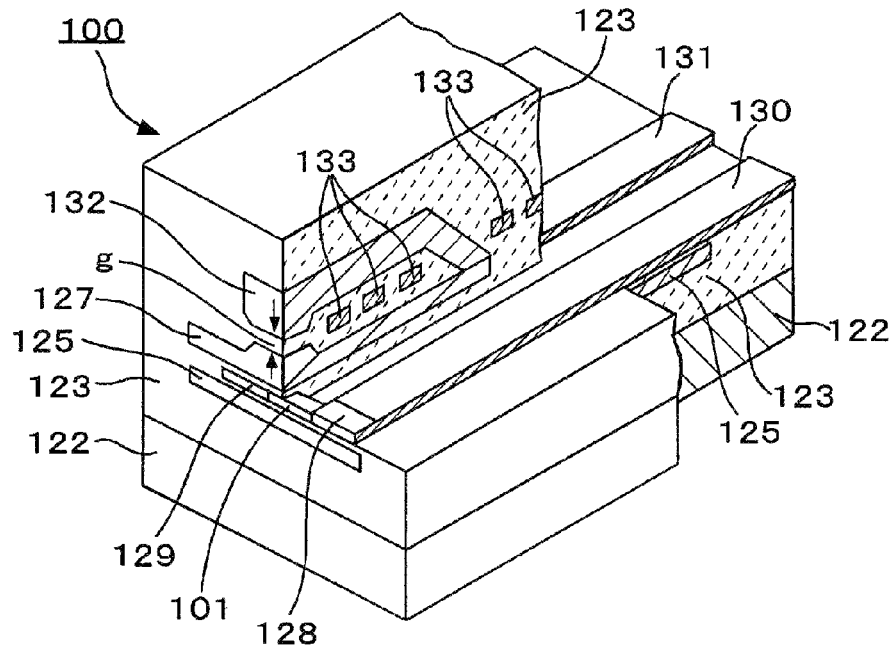
[FIG. 11A]
Figure 11B:
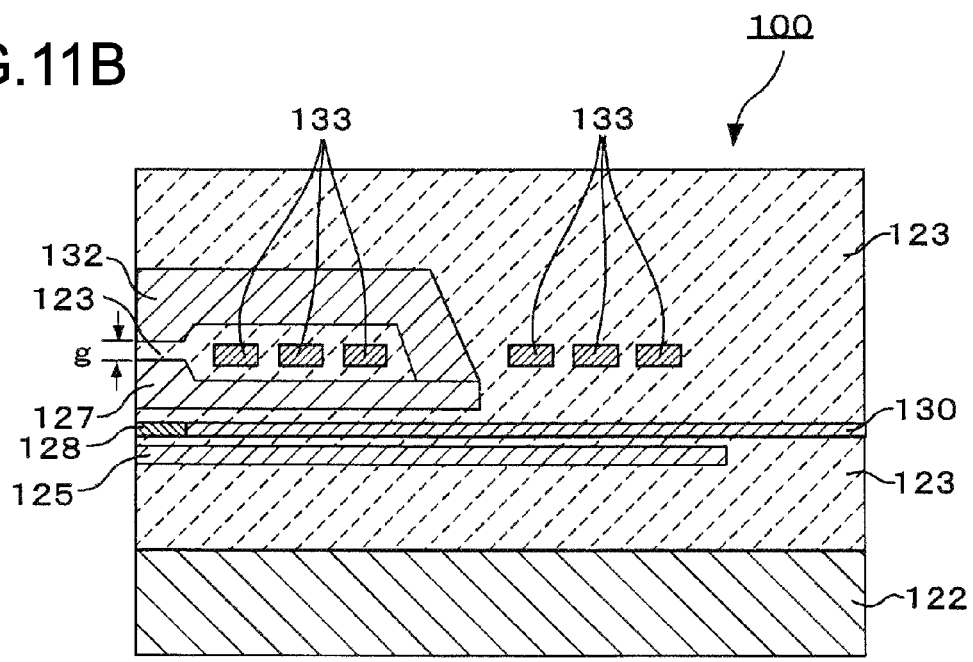
[FIG. 11B]

As an example, a magnetoresistive effect element 101, which has the structure of the storage element 3 or 20 and is applied to a combined type magnetic head 100, is shown in FIG. 11A and FIG. 11B. FIG. 11A is a perspective view of the combined type magnetic head 100 with parts broken away to reveal the inner structure of the head 100, and FIG. 11B is a cross-sectional view of the combined type magnetic head 100.

The combined type magnetic head 100 is a magnetic head used for a hard disc device and the like. The head 100 has a magnetoresistive effect type magnetic head, to which the present technology is applied, formed on a substrate 122 and also has an inductive type magnetic head formed so as to be laminated on the magnetoresistive effect type magnetic head. Here, the magnetoresistive effect type magnetic head is operated as a head for reproduction, and the inductive type magnetic head is operated as a head for recording. That is, this combined type magnetic head 100 has the combination of a head for reproduction and head for recording.

The magnetoresistive effect type magnetic head loaded on the combined type magnetic head 100 is a so-called shield type MR head, and has a first magnetic shield 125 formed on the substrate 122 via an insulating layer 123, the magnetoresistive effect element 101 formed on the first magnetic shield 125 via the insulating layer 123, and a second magnetic shield 127 formed on the magnetoresistive effect element 101 via the insulating layer 123. The insulating layer 123 is formed of an insulating material such as $Al_2O_3$ or $SiO_2$.

The first magnetic shield 125 magnetically shields the lower layer side of the magnetoresistive effect element 101 and is formed of a soft magnetic material such as Ni—Fe. On this first magnetic shield 125, the magnetoresistive effect element 101 is formed via the insulating layer 123.

The magnetoresistive effect element 101 functions as a magnetic sensing element that detects a magnetic signal from a magnetic recording medium, in the magnetoresistive effect type magnetic head. This magnetoresistive effect element 101 has the same film structure as that of the storage element 3 or 20 described above.

This magnetoresistive effect element 101 is formed approximately in a rectangular shape and has a side surface exposed to a surface facing a magnetic recording medium. On both ends of this magnetoresistive effect element 101, bias layers 128 and 129 are located. Further, connecting terminals 130 and 131 respectively connected with the bias layers 128 and 129 are formed. A sensing current is given to the magnetoresistive effect element 101 via the connecting terminals 130 and 131.

Moreover, a second magnetic shield 127 is located on the upper portion of the bias layers 128 and 129 via the insulating layer 123.

The inductive type magnetic head laminated and formed on the magnetoresistive effect type magnetic head has a magnetic core, including the second magnetic shield 127 and an upper layer core 132, and a thinned film coil 133 formed so as to be wound around the magnetic core.

The upper layer core 132 forms a closed magnetic circuit in cooperation with the second magnetic shield 127 and acts as a magnetic core of this inductive type magnetic head. The core 132 is formed of a soft magnetic material such as Ni—Fe. Here, the second magnetic shield 127 and the upper layer core 132 are formed so as to have front end portions, exposed to the surface facing the magnetic recording medium, and to be adjacent to each other in rear end portions thereof. Here, the front end portions of the second magnetic shield 127 and the upper layer core 132 are formed such that the layer 127 and the core 132 are away from each other by a predetermined gap g on the surface facing the magnetic recording medium. That is, in the combined type magnetic head 100, the second magnetic shield 127 magnetically shields the upper layer side of the magnetoresistive effect element 101 and also acts as a magnetic core of the inductive type magnetic head. This magnetic core of the inductive type magnetic head is formed by the second magnetic shield 127 and the upper layer core 132. The gap g denotes a recording magnetic gap of the inductive type magnetic head.

Further, the thinned film coil 133 buried into the insulating layer 123 is formed on the second magnetic shield 127. Here, the thinned film coil 133 is formed so as to be wound around the magnetic core composed of the second magnetic shield 127 and the upper layer core 132. Both end portions (not shown) of this thinned film coil 133 are exposed to the outside to form external connecting terminals of the inductive type magnetic head on both ends of the coil 133. That is, when a magnetic signal is recorded on the magnetic recording medium, a recording current is given from the external connecting terminals to the thinned film coil 133.

The combined type magnetic head 121 as described above is equipped with the magnetoresistive effect type magnetic head as a head for reproduction, and this magnetoresistive effect type magnetic head has the magnetoresistive effect element 101, to which the present technology is applied, as a magnetic sensing element for detecting a magnetic signal from the magnetic recording medium. Because the magnetoresistive effect element 101, to which the present technology is applied, has very superior characteristics as described above, this magnetoresistive effect type magnetic head may deal with the further heightening of the recording density in the magnetic recording.

The present technique may adopt following structures.

(1) A storage element comprising: a magnetization fixed layer; and a magnetization free layer including a plurality of ferromagnetic layers laminated together with a coupling layer formed between each pair of adjacent ferromagnetic layers, wherein magnetization directions of the ferromagnetic layers are inclined with respect to a magnetization direction of the magnetization fixed layer.

(2) The magnetic storage element according to (1), further comprising a nonmagnetic intermediate layer formed between the magnetization fixed layer and the magnetization free layer.

(3) The magnetic storage element according to (2), wherein the intermediate layer is formed of insulating materials and is a tunnel insulating layer.

(4) The magnetic storage element according to (1), wherein a magnetization direction of the magnetization fixed layer in a direction perpendicular to a film surface of the magnetization fixed layer.

(5) The magnetic storage element according to (1), further comprising an underlying layer and an anti-ferromagnetic layer formed between the underlying layer and the magnetization fixed layer.

(6) The magnetic storage element according to (1), wherein the magnetization free layer includes a first ferromagnetic layer and a second ferromagnetic layer with one of the coupling layers formed therebetween, wherein a perpendicular axis extends in a direction perpendicular to a film surface of the magnetization free layer through the magnetization free layer, wherein an angle between the direction of magnetization of the first ferromagnetic layer and the perpendicular axis is $\theta_1$, and wherein an angle between the direction of the magnetization of the second ferromagnetic layer and the perpendicular axis is defined as $\theta_2$.

(7) The magnetic storage element according to (6), wherein a reference line passes through a center of the first and second ferromagnetic layers in a top view, and wherein when the a first magnetization M1 of the first ferromagnetic layer and a second magnetization M2 of the second ferromagnetic layer are respectively projected onto film surfaces of the first and second ferromagnetic layers, an angle between the direction of the first magnetization M1 and the reference line is defined as $\phi_1$, and the angle between the direction of the second magnetization M2 and the reference line is defined as $\phi_2$.

(8) The magnetic storage element according to (7), wherein a magnetic energy $\in$ of the storage layer 24 is expressed by the following Equation 2:

$$\in = \Delta_1 \sin^2\theta_1 + \Delta_2 \sin^2\theta_2 - \Delta_{ex}(\cos\theta_1 \cos\theta_2 + \sin\theta_1 \sin_2 \cos(\phi_1-\phi_2)),$$

wherein a first energy difference obtained by subtracting a strength of the mag energy at the time the first magnetization M1 is directed to the perpendicular direction ($\theta_1$=0 degree) from a strength of the magnetic energy at the time the first magnetization M1 is directed to an in-surface direction ($\theta_1$=90 degrees) is indicated by $\Delta_1$, wherein a second energy difference obtained by subtracting a strength of the magnetic energy at the time the second magnetization M2 is directed to the perpendicular direction ($\theta_2$=0 degree) from a strength of the magnetic energy at the time the second magnetization M2 is directed to an in-surface direction ($\theta_2$=90 degrees) is indicated by $\Delta_2$, and wherein a strength of the magnetic coupling energy between the fist magnetization M1 and the second magnetization M2 is indicated by $\Delta_{ex}$.

(9) The magnetic storage element according to (8), wherein one of the following conditions apply: (a) if a first energy difference $\Delta_1$ is positive, the second energy difference $\Delta_2$ is negative; and (b) if a first energy difference $\Delta_1$ is negative, the second energy difference $\Delta_2$ is positive.

(10) The magnetic storage element according to (8), wherein the following condition is satisfied: abs($\Delta_{ex}$) <abs($2\times\Delta_1\times\Delta_2/(\Delta_1+\Delta_2)$).

(11) The magnetic storage element according to (1), wherein the magnetization free layer includes a first ferromagnetic layer having a first magnetization M1, a second ferromagnetic layer having a second magnetization M2, and one of the coupling layers formed therebetween, and wherein a first magnetization direction of the first ferromagnetic layer is inclined with respect o a second magnetization direction of the second ferromagnetic layer.

The present technique may also adopt following structures.

(12) A method of writing information to a storage element including a magnetization fixed layer, and a magnetization free layer including a plurality of ferromagnetic layers laminated together with a coupling layer formed between each pair of adjacent ferromagnetic layers, the method comprising: applying a current in a magnetization direction of the magnetization fixed layer to cause a spin torque magnetization reversal in the magnetization free layer, wherein magnetization directions of the ferromagnetic layers are inclined with respect to the magnetization direction of the magnetization fixed layer.

(13) The method according to (12), wherein the storage element further includes a nonmagnetic intermediate layer formed between the magnetization fixed layer and the magnetization free layer.

(14) The method according to (13), wherein the intermediate layer is formed of insulating materials and is a tunnel insulating layer.

(15) The method according to (12), wherein a magnetization direction of the magnetization fixed layer is in a direction perpendicular to a film surface of the magnetization fixed layer.

(16) The method according to (12), further comprising an underlying layer and an anti-ferromagnetic layer formed between the underlying layer and the magnetization fixed layer.

(17) The method according to (12), wherein the magnetization free layer includes a first ferromagnetic layer and a second ferromagnetic layer with one of the coupling layers formed therebetween, wherein a perpendicular axis extends in a direction perpendicular to a film surface of the magnetization free layer through the magnetization free layer, wherein an angle between the direction of magnetization of the first ferromagnetic layer and the perpendicular axis is $\theta_1$, and wherein an angle between the direction of the magnetization of the second ferromagnetic layer and the perpendicular axis is defined as $\theta_2$.

(18) The method according to (17), wherein a reference line passes through a center of the first and second ferromagnetic layers in a top view, and wherein when the a first magnetization M1 of the first ferromagnetic layer and a second magnetization M2 of the second ferromagnetic layer are respectively projected onto film surfaces of the first and second ferromagnetic layers, an angle between the direction of the first magnetization M1 and the reference line is defined as $\phi_1$, and the angle between the direction of the second magnetization M2 and the reference line is defined as $\theta_2$.

(19) The method according to (18), wherein a magnetic energy $\in$ of the storage layer 24 is expressed by the following Equation 2:

$$\in = \Delta_1 \sin^2\theta_1 + \Delta_2 \sin^3\theta_2 - \Delta_{ex}(\cos\theta_1 \cos\theta_2 + \sin\theta_1 \sin\theta_2 \cos(\phi_1 - \phi_2)),$$

wherein a first energy difference obtained by subtracting a strength of the magnetic energy at the time the first magnetization M1 is directed to the perpendicular direction ($\theta_1=0$ degree) from a strength of the magnetic energy at the time the first magnetization M1 is directed to an in-surface direction ($\theta_1=90$ degrees) is indicated by $\Delta_1$, wherein a second energy difference obtained by subtracting a strength of the magnetic energy at the time the second magnetization M2 is directed to the perpendicular direction ($\theta_2=0$ degree) from a strength of the magnetic energy at the time the second magnetization M2 is directed to an in-surface direction ($\theta_2=90$ degrees) is indicated by $\Delta_2$, and wherein a strength of the magnetic coupling energy between the fist magnetization M1 and the second magnetization M2 is indicated by $\Delta_{ex}$.

(20) The method according to (19), wherein one of the following conditions apply: (a) if a first energy difference $\Delta_1$ is positive, the second energy difference $\Delta_2$ is negative; and (b) if a first energy difference $\Delta 1$ is negative, the second energy difference $\Delta 2$ is positive.

(21) The method according to (19), wherein the following condition is satisfied: $abs(\Delta_{ex}) < abs(2 \times \Delta_1 \times \Delta_2/(\Delta_1 + \Delta_2))$.

(22) The method according to (12), wherein the magnetization free layer includes a first ferromagnetic layer having a first magnetization M1 and a second ferromagnetic layer having a second magnetization M2, and one of the coupling layers formed therebetween, and wherein a first magnetization direction of the first ferromagnetic layer is inclined with respect to a second magnetization direction of the second ferromagnetic layer.

The present technique may also adopt following structures.

(23) A spin torque magnetic random access memory element comprising: a magnetization fixed layer having a fixed magnetization in a perpendicular direction relative to a film surface of the magnetization fixed layer; a magnetization free layer including a plurality of ferromagnetic layers laminated together with a coupling layer formed between each pair of adjacent ferromagnetic layers, thereby magnetically coupling the ferromagnetic layers; and a nonmagnetic layer formed between the magnetization fixed layer and the magnetization free layer, wherein magnetization directions of the ferromagnetic layers are inclined with respect to the perpendicular direction.

(24) The spin torque magnetic random access memory element according to (23), wherein the nonmagnetic layer is formed of insulating materials and is a tunnel insulating layer.

(25) The spin torque magnetic random access memory element according to (24), wherein a magnetization direction of the magnetization fixed layer is in a direction perpendicular to a film surface of the magnetization fixed layer.

(26) The spin torque magnetic random access memory element according to (23), further comprising an underlying layer and an anti-ferromagnetic layer formed between the underlying layer and the magnetization fixed layer.

(27) The spin torque magnetic random access memory element according to (23), wherein the magnetization free layer includes a first ferromagnetic layer and a second ferromagnetic layer with one of the coupling layers formed therebetween, wherein a perpendicular axis extends in a direction perpendicular to a film surface of the magnetization free layer through the magnetization free layer, wherein an angle between the direction of magnetization of the first ferromagnetic layer and the perpendicular axis is $\theta_1$, and wherein an angle between the direction of the magnetization of the second ferromagnetic layer and the perpendicular axis is defined as $\theta_2$.

(28) The spin torque magnetic random access memory element according to (27), wherein a reference line passes through a center of the first and second ferromagnetic layers in a top view, and wherein when the a first magnetization M1 of the first ferromagnetic layer and a second magnetization M2 of the second ferromagnetic layer are respectively projected onto film surfaces of the first acrd second ferromagnetic layers, an angle between the direction of the first magnetization M1 and the reference line is defined as $\phi_1$, and the angle between the direction of the second magnetization M2 and the reference line is defined as $\phi_2$.

(29) The spin torque magnetic random access memory element according to (28), wherein a magnetic energy $\in$ of the storage layer 24 is expressed by the following Equation 2:

$$\in = \Delta_1 \sin^2\theta_1 + \Delta_2 \sin^2\theta_2 - \Delta_{ex}(\cos\theta_1 \cos\theta_2 + \sin\theta_1 \sin\theta_2 \cos(\phi_1 - \phi_2))$$

wherein a first energy difference obtained by subtracting a strength of the magnetic energy at the time the first magnetization M1 is directed to the perpendicular direction ($\theta_1=0$ degree) from a strength of the magnetic energy at the time the first magnetization M1 is directed to an in-surface direction ($\theta_1=90$ degrees) is indicated by $\Delta_1$, wherein a second energy difference obtained by subtracting a strength of the magnetic energy at the time the second magnetization M2 is directed to the perpendicular direction ($\theta_2=0$ degree) from a strength of the magnetic energy at the time the second magnetization M2 is directed to an in-surface direction ($\theta_2=90$ degrees) is indicated by $\Delta_2$, and wherein a strength of the magnetic coupling energy between the fist magnetization M1 and the second magnetization M2 is indicated by $\Delta_{ex}$.

(30) The spin torque magnetic random access memory element according to (23), wherein one of the following conditions apply: (a) if a first energy difference $\Delta_1$ is positive, the second energy difference $\Delta_2$ is negative; and (b) if a first energy difference $\Delta 1$ is negative, the second energy difference $\Delta 2$, is positive.

(31) The spin torque magnetic random access memory element according to (29), wherein the following condition is satisfied: $abs(\Delta_{ex}) < bs(2 \times \Delta_1 \times \Delta_2/(\Delta_1+\Delta_2))$.

(32) The spin torque magnetic random access memory element according to (23), wherein the magnetization free layer includes a first ferromagnetic layer having a first magnetization M1, a second ferromagnetic layer having a second magnetization M2, and one of the coupling layers formed therebetween, and wherein a first magnetization direction of the first ferromagnetic layer is inclined with respect to a second magnetization direction of the second ferromagnetic layer.

The present technique may also adopt following structures.

(33) A magnetoresistive effect type magnetic head comprising: a first magnetic shield formed on a substrate via an insulating layer; a magnetic sensing element including a magnetization fixed layer, and a magnetization free layer including a plurality of ferromagnetic layers laminated together with a coupling layer formed between each pair of adjacent ferromagnetic layers; and a secont, magnetic shield formed on the magnetic sensing element via the insulating layer, wherein magnetization directions of the ferromagnetic layers are inclined with respect to a magnetization direction of the magnetization fixed layer.

(34) The magnetoresistive effect type magnetic head according to (33), wherein the magnetic sensing element is formed in an approximate rectangular shape and has a side surface exposed to a surface facing a magnetic recording medium.

(35) The magnetoresistive effect type magnetic head according to (33), further comprising bias layers formed on both ends of the magnetic sensing element.

(36) The magnetoresistive effect type magnetic head according to (35), further comprising connecting terminals respectively connected with the bias layers, and the connecting terminals are configured to transmit a sensing current to the magnetic sensing element.

The present technique may also adopt following structures.

(1) A storage element, having a layer structure including: a storage layer in which a direction of a magnetization is changed according to information; an intermediate layer being a nonmagnetic substance; and a magnetization fixed layer, located on the storage layer via the intermediate layer, in which a direction of a magnetization is fixed, in which the storage layer is configured to laminate at least two ferromagnetic layers on each other via a coupling layer, the two ferromagnetic layers being magnetically coupled with each other via the coupling layer, directions of magnetizations of the two ferromagnetic layers being inclined with respect to a direction perpendicular to film surfaces of the ferromagnetic layers, and a magnetized state of the recording layer is changed by a current flowing in a lamination direction of the layer structure to perform recording of the information on the storage layer.

(2) The storage element according to (1), in which one of the ferromagnetic layers is configured to have magnetic energy of a value which is obtained by subtracting a value of the magnetic energy of the ferromagnetic layer, in which the direction of the magnetization is perpendicular to a film surface of the ferromagnetic layer, from a value of the magnetic energy of the ferromagnetic layer in which the magnetization is directed to an in-surface direction in the film surface, the other ferromagnetic layer is configured to have magnetic energy of a value which is obtained by subtracting a value of the magnetic energy of the other ferromagnetic layer, in which the direction of the magnetization is perpendicular to a film surface of the other ferromagnetic layer, from a value of the magnetic energy of the other ferromagnetic layer in which the magnetization is directed to an surface direction in the film surface of the other ferromagnetic layer, and signs of the values in the magnetic energy of the ferromagnetic layers are differentiated from each other.

(3) The storage element according to (2), in which the two ferromagnetic layers are magnetically coupled with each other via the coupling layer at magnetic energy of a predetermined value, and an absolute value of the predetermined value of the magnetic energy is lower than an absolute value of a value which is obtained by doubling a value obtained by dividing a product of the value of the magnetic energy of one of the ferromagnetic layers and the value of the magnetic energy of the other ferromagnetic layer by a sum of the value of the magnetic energy of one of the ferromagnetic layers and the value of the magnetic energy of the other ferromagnetic layer.

(4) The storage element according to (2) or (3), in which a value of an index of thermal stability is set between a value, which is obtained by adding the vale of the magnetic energy of one of the ferromagnetic layers to the value of the magnetic energy of the other ferromagnetic layer, and a maximum value between the value of the magnetic energy of one of the ferromagnetic layers and the value of the magnetic energy of the other ferromagnetic layer.

(5) The storage element according to any one of (2) to (4), in which the value of the index of thermal stability is equal to or higher than forty.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

REFERENCE SIGNS LIST 1 gate electrode
7 element separating layer
3, 20 storage element
4 contact layer
6 bit lines
7 source region
8 drain region
9 wires
10 semiconductor substrate
11, 21 underlayer
12, 22 magnetization fixed layer
13, 23 intermediate layer
14, 24 storage layer
15, 25 cap layer
100 combined type magnetic head
122 substrate
123 insulating layer
125 first magnetic shield
127 second magnetic shield
128, 129 bias layers
130, 131 connecting terminals
132 upper core
133 thinned film coil

The invention claimed is:

1. A storage element comprising:
a magnetization fixed layer;
a magnetization free layer including a plurality of ferromagnetic layers laminated together with a coupling layer formed between each pair of adjacent ferromagnetic layers; and
a nonmagnetic intermediate layer that is a tunnel insulating layer and is formed between the magnetization fixed layer and the magnetization free layer,
wherein magnetization directions of the ferromagnetic layers are inclined with respect to a magnetization direction of the magnetization fixed layer.

2. The magnetic storage element according to claim 1, wherein a magnetization direction of the magnetization fixed layer is in a direction perpendicular to a film surface of the magnetization fixed layer.

3. The magnetic storage element according to claim 1, further comprising an underlying layer and an anti-ferromagnetic layer formed between the underlying layer and the magnetization fixed layer.

4. The magnetic storage element according to claim 1,
wherein the magnetization free layer includes a first ferromagnetic layer and a second ferromagnetic layer with one of the coupling layers formed therebetween,
wherein a perpendicular axis extends in a direction perpendicular to a film surface of the magnetization free layer through the magnetization free layer,
wherein an angle between the direction of magnetization of the first ferromagnetic layer and the perpendicular axis is $\theta_1$, and
wherein an angle between the direction of the magnetization of the second ferromagnetic layer and the perpendicular axis is defined as $\theta_2$.

5. The magnetic storage element according to claim 4,
wherein a reference line passes through a center of the first and second ferromagnetic layers in a top view, and
wherein when a first magnetization M1 of the first ferromagnetic layer and a second magnetization M2 of the second ferromagnetic layer are respectively projected onto film surfaces of the first and second ferromagnetic layers, an angle between the direction of the first magnetization M1 and the reference line is defined as $\phi_1$, and the angle between the direction of the second magnetization M2 and the reference line is defined as $\phi_2$.

6. The magnetic storage element according to claim 5,
wherein a magnetic energy $\epsilon$ of the storage layer 24 is expressed by the following Equation 2:

$$\epsilon = \Delta_1 \sin^2\theta_1 + \Delta_2 \sin^2\theta_2 - \Delta_{ex}(\cos\theta_1 \cos\theta_2 + \sin\theta_1 \sin\theta_2 \cos(\phi_1-\phi_2))$$

wherein a first energy difference obtained by subtracting a strength of the magnetic energy at the time the first magnetization M1 is directed to the perpendicular direction ($\theta_1=0$ degree) from a strength of the magnetic energy at the time the first magnetization M1 is directed to an in-surface direction ($\theta_1=90$ degrees) is indicated by $\Delta_1$,
wherein a second energy difference obtained by subtracting a strength of the magnetic energy at the time the second magnetization M2 is directed to the perpendicular direction ($\theta_2=0$ degree) from a strength of the magnetic energy at the time the second magnetization M2 is directed to an in-surface direction ($\theta_2=90$ degrees) is indicated by $\Delta_2$, and
wherein a strength of the magnetic coupling energy between the fist magnetization M1 and the second magnetization M2 is indicated by $\Delta_{ex}$.

7. The magnetic storage element according to claim 6, wherein one of the following conditions apply:
(a) if a first energy difference $\Delta_1$ is positive, the second energy difference $\Delta_2$ is negative; and
(b) if a first energy difference $\Delta_1$ is negative, the second energy difference $\Delta_2$ is positive.

8. The magnetic storage element according to claim 6, wherein the following condition is satisfied:

$$abs(\Delta_{ex}) < abs(2 \times \Delta_1 \times \Delta_2/(\Delta_1+\Delta_2)).$$

9. The magnetic storage element according to claim 1,
wherein the magnetization free layer includes a first ferromagnetic layer having a first magnetization M1, a second ferromagnetic layer having a second magnetization M2, and one of the coupling layers formed therebetween, and
wherein a first magnetization direction of the first ferromagnetic layer is inclined with respect to a second magnetization direction of the second ferromagnetic layer.

10. A method of writing information to a storage element including a magnetization fixed layer, a magnetization free layer including a plurality of ferromagnetic layers laminated together with a coupling layer formed between each pair of adjacent ferromagnetic layers, and a nonmagnetic intermediate layer that is a tunnel insulating layer and is formed between the magnetization fixed layer and the magnetization free layer, the method comprising:

applying a current in a magnetization direction of the magnetization fixed layer to cause a spin torque magnetization reversal in the magnetization free layer, wherein magnetization directions of the ferromagnetic layers are inclined with respect to the magnetization direction of the magnetization fixed layer.

11. The method according to claim 10, wherein a magnetization direction of the magnetization fixed layer is in a direction perpendicular to a film surface of the magnetization fixed layer.

12. The method according to claim 10, wherein the magnetization free layer includes a first ferromagnetic layer having a first magnetization M1 and a second ferromagnetic layer having a second magnetization M2, and one of the coupling layers formed therebetween, and wherein a first magnetization direction of the first ferromagnetic layer is inclined with respect to a second magnetization direction of the second ferromagnetic layer.

13. A spin torque magnetic random access memory element comprising:

a magnetization fixed layer having a fixed magnetization in a perpendicular direction relative to a film surface of the magnetization fixed layer;

a magnetization free layer including a plurality of ferromagnetic layers laminated together with a coupling layer formed between each pair of adjacent ferromagnetic layers, thereby magnetically coupling the ferromagnetic layers; and a nonmagnetic layer that is a tunnel insulating layer and is formed between the magnetization fixed layer and the magnetization free layer, wherein magnetization directions of the ferromagnetic layers are inclined with respect to the perpendicular direction.

14. The spin torque magnetic random access memory element according to claim 13, wherein a magnetization direction of the magnetization fixed layer is in a direction perpendicular to a film surface of the magnetization fixed layer.

15. The spin torque magnetic random access memory element according to claim 13, further comprising an underlying layer and an anti-ferromagnetic layer formed between the underlying layer and the magnetization fixed layer.

16. The spin torque magnetic random access memory element according to claim 13, wherein the magnetization free layer includes a first ferromagnetic layer having a first magnetization M1, a second ferromagnetic layer having a second magnetization M2, and one of the coupling layers formed therebetween, and wherein a first magnetization direction of the first ferromagnetic layer is inclined with respect to a second magnetization direction of the second ferromagnetic layer.

17. A magnetoresistive effect type magnetic head comprising:

a first magnetic shield formed on a substrate via an insulating layer;

a magnetic sensing element including a magnetization fixed layer, a magnetization free layer including a plurality of ferromagnetic layers laminated together with a coupling layer formed between each pair of adjacent ferromagnetic layers, and a nonmagnetic intermediate layer that is a tunnel insulating layer and is formed between the magnetization fixed layer and the magnetization free layer; and a second magnetic shield formed on the magnetic sensing element via the insulating layer, wherein magnetization directions of the ferromagnetic layers are inclined with respect to a magnetization direction of the magnetization fixed layer.

18. The magnetoresistive effect type magnetic head according to claim 17, wherein the magnetic sensing element is formed in an approximate rectangular shape and has a side surface exposed to a surface facing a magnetic recording medium.

19. A storage element comprising:

a magnetization fixed layer; and a magnetization free layer including a plurality of ferromagnetic layers laminated together with a coupling layer formed between each pair of adjacent ferromagnetic layers, wherein magnetization directions of the ferromagnetic layers are inclined with respect to a magnetization direction of the magnetization fixed layer, the magnetization direction of the magnetization fixed layer being in a direction perpendicular to a film surface of the magnetization fixed layer.

20. A storage element comprising:

a magnetization fixed layer; and a magnetization free layer including first and second ferromagnetic layers laminated together with a coupling layer formed therebetween, wherein a magnetization direction of the fixed layer is perpendicular to a film surface of the fixed layer, and magnetization directions of the first and second ferromagnetic layers are inclined with respect to the magnetization direction of the magnetization fixed layer, wherein the magnetization free layer includes a first ferromagnetic layer and a second ferromagnetic layer with one of the coupling layers formed therebetween, wherein a perpendicular axis extends in a direction perpendicular to a film surface of the magnetization free layer through the magnetization free layer, wherein an angle between the direction of magnetization of the first ferromagnetic layer and the perpendicular axis is $\theta_1$, and wherein an angle between the direction of the magnetization of the second ferromagnetic layer and the perpendicular axis is defined as $\theta_2$.

21. The storage element according to claim 20, wherein the magnetization directions of the first and second ferromagnetic layers are inclined with respect to one another.

* * * * *